United States Patent
Kawase et al.

(10) Patent No.: US 6,628,214 B1
(45) Date of Patent: Sep. 30, 2003

(54) DESERIALIZER, SEMICONDUCTOR DEVICE, ELECTRONIC DEVICE, AND DATA TRANSMISSION SYSTEM

(75) Inventors: Takeo Kawase, Cambridge (GB); Shojiro Kitamura, Fujimi-Cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/530,450

(22) PCT Filed: Aug. 27, 1999

(86) PCT No.: PCT/JP99/04663

§ 371 (c)(1),
(2), (4) Date: May 1, 2000

(87) PCT Pub. No.: WO00/13320

PCT Pub. Date: Mar. 9, 2000

(30) Foreign Application Priority Data

Sep. 1, 1998 (JP) .......................................... 10-262331

(51) Int. Cl.$^7$ ................................................ H03M 9/00
(52) U.S. Cl. ...................... 341/100; 341/101; 370/535
(58) Field of Search ................................ 341/100, 101; 370/112, 110.1

(56) References Cited

U.S. PATENT DOCUMENTS

| | | | | |
|---|---|---|---|---|
| 4,606,022 A | * | 8/1986 | Suzuki et al. | 370/438 |
| 4,694,294 A | * | 9/1987 | Suzuki et al. | 340/825.2 |
| 4,706,245 A | * | 11/1987 | Suzuki et al. | 340/825.21 |
| 5,426,644 A | * | 6/1995 | Fujimoto | 370/535 |
| 5,818,846 A | * | 10/1998 | Mori et al. | 370/532 |

FOREIGN PATENT DOCUMENTS

| | | |
|---|---|---|
| JP | A-63-107247 | 5/1988 |
| JP | A-1-188132 | 7/1989 |
| JP | A-3-220591 | 9/1991 |
| JP | A-4-369984 | 12/1992 |
| JP | A-5-30096 | 2/1993 |
| JP | A-5-175951 | 7/1993 |
| JP | A-5-344113 | 12/1993 |
| JP | A-6-14061 | 1/1994 |
| JP | A-7-38551 | 2/1995 |
| JP | A-7-264177 | 10/1995 |
| JP | A-7-288502 | 10/1995 |
| JP | A-7-295786 | 11/1995 |
| JP | A-8-307404 | 11/1996 |

* cited by examiner

*Primary Examiner*—Brian Young
*Assistant Examiner*—John B Nguyen
(74) *Attorney, Agent, or Firm*—Oliff & Berridge, PLC

(57) ABSTRACT

A serial-to-parallel converter (130) samples serial data DA1 comprising a first data string, which includes one or more unit data strings each including a predetermined number of bits (00XXX . . . XXX) and which is input after a synchronization period, in accordance with a clock signal CL1 which has been used to generate the serial data by converting original parallel data into serial form, thereby converting the serial data to parallel data from one unit data string to another. Signal generation means (140) generates a synchronization signal corresponding to a synchronization period in accordance with the serial data DA1 and the clock signal CL1. The serial data includes a second data string (1100 . . . 000) which appears in each synchronization period and which includes one or more unit data strings having a predetermined bit pattern. If the signal generation means (140) detects a unit data string (11000 . . . 000) in the second data string, it generates a synchronization signal. In accordance with the synchronization signal, the serial-to-parallel converter (130) detects the start position of the unit data string in the first data string.

21 Claims, 18 Drawing Sheets

WHEN A LUMINANCE SIGNAL IS BEING TRANSMITTED
1001010001000101010010011100000000000010011110001110101

WHEN THE VIDEO SYNCHRONIZATION SIGNAL IS ENABLED
1110000000000000000000011100000000000000000000000000000

DESERIALIZER, SEMICONDUCTOR DEVICE, ELECTRONIC DEVICE, AND DATA TRANSMISSION SYSTEM

BACKGROUND OF THE INVENTION

1. Field of the Invention

The present invention relates to a serial-to-parallel conversion apparatus, a semiconductor device, an electronic device, and a data transmission system, and more particularly to an apparatus for transmitting digital image information from an information processing apparatus to a device such as a liquid crystal display, a large-size high-resolution flat panel display, a liquid crystal projector, or a multi-display system.

2. Description of Related Art

A data transmission system for transmitting image information such as that shown in FIG. 16 is known in the art. In such a system, it is known to use one or more pairs of wires as transmission means for transmitting digital image information to a display device. This technique is called LVDS (low voltage differential signal) transmission.

In the data transmission system shown in FIG. 16, data is transmitted from one information processing apparatus 500 to another information processing apparatus 600 via an LVDS cable.

In a transmitting apparatus, parallel data 513 such as image information output from the information processing apparatus 500 at the transmitting end is converted into serial data 514 by a parallel-to-serial converter 520 in accordance with a clock signal CL 511 produced by a PLL 530 by way of multiplying the frequency of a dot clock signal CL 510.

The resultant serial data 514 is transmitted together with a clock signal CL 512 similar to the dot clock signal CL 510 via drivers 540 (540-1, 540-2, . . . ), a cable 560, and receivers 630 (630-1, 630-2, . . . ).

In accordance with a clock signal CL 602 generated by a PLL 620 by way of multiplying the frequency of a clock signal CL 601 similar to the clock signal CL 512, a serial-to-parallel converter 610 converts the serial data 604 to parallel data 605 and supplies the resultant parallel data 605 to the information processing apparatus 600.

In the case where the cable comprising one or more pairs of wires, the dot clock signal CL 510 (512, 601, 603) and the coded serial data 514 (604) are transmitted, while in the receiving apparatus the clock signal CL 602 is generated by multiplying the frequency of the dot clock signal CL 601 and the serial data is reconverted to parallel data in accordance with the obtained clock signal CL 602.

When serial data is converted to parallel data, it is required to detect boundaries (start positions of respective data strings) between two adjacent data strings of the serial data. As can be seen from FIG. 18, information used to detect the boundaries is given by the clock signal CL 601 (CL 510, CL 512). Because one cycle of the clock signal CL 601 corresponds to the length of one unit data string, the timing of each rising edge (or falling edge) of the clock signal CL 601 has a particular relation with the start position of a data string of the serial data 604. Therefore, the start position of each data string of the serial data 604 can be detected by detecting a rising edge (or falling edge) of the clock signal CL 601, and thus it is possible to convert serial data to parallel data without producing a bit position error.

However, the dot clock signal CL 510 output from the information processing apparatus 500 often has large jitter which affects extraction of the clock signal or multiplication of the dot clock signal performed in the receiving apparatus and thus causes a failure in conversion to parallel data or in reproduction of data.

That is, as shown in FIGS. 16 and 18, when parallel data (A0), . . . , (Ak) are input to the parallel-to-serial converter 520 via parallel data input terminals Txin0–Txink, the parallel-to-serial converter 520 sequentially samples the parallel data (A0), . . . , (Ak) from data to data in synchronization with the clock signal CL 511 generated by means of frequency multiplication thereby converting them into serial data (A0 . . . Ak).

The resultant serial data (A0 . . . Ak) is output together with the dot clock signal CL510 from the driver 540 and transmitted via the LVDS cable 560.

The serial data (A0 . . . Ak) 604 is then input, as shown in FIGS. 16 and 18, to the serial-to-parallel converter 610 via the serial data input terminal Rxin and sampled in synchronization with the clock signal CL602 generated by way of frequency multiplication.

As described above, because the start position of the serial data (A0 . . . Ak) can be detected from the timing of a rising edge (or falling edge) of the clock signal CL601, it is possible to output the parallel data (A0), . . . , (Ak) so that A0 corresponds to Rxout0 and A1 corresponds to Rxout1.

If jitter occurs in the clock signal CL510, a phase difference occurs between the clock signal CL511 multiplied in the transmitting apparatus and the clock signal CL602 multiplied in the receiving apparatus, as shown in FIG. 19, and thus the serial-to-parallel converter 610 cannot perform a correct conversion upon the parallel data converted into serial form by the parallel-to-serial converter 520. The term "jitter" is generally used to describe a waveform disturbance such as that shown in FIG. 19.

More specifically, referring to the timing chart of FIG. 17 illustrating the relationship among the serial data 604, the parallel data 605, and CL602 (multiplied signal) in the serial-to-parallel converter 610, jitter causes a deviation between the timing of the clock signal CL601 or 602 and the start position of the nth data string of the serial data. Such a deviation can cause incorrect detection of a boundary between adjacent data strings (the start position of a data string) of the serial data.

The major cause of the above problem is in that the serial-to-parallel converter 610 performs the converting operation in synchronization with the clock signal CL602 multiplied by the PLL 620.

In the parallel-to-serial converter 520, the clock signal 511 is generated by the PLL 520 by way of frequency multiplication, while in the serial-to-parallel converter 610 the clock signal 602 is generated by the PLL 620 by way of frequency multiplication. Therefore, if the clock signal 510 includes jitter, a timing deviation between the clock signals 511 and 602 occurs as shown in FIG. 19. When there is such jitter, if the serial data 604 generated on the basis of the multiplied clock signal 511 is sampled in synchronization with the clock signal 602, the resultant parallel data may be incorrect.

The phase error generated by the jitter can cause an incorrect detection of a signal level. For example, a signal level which should be determined as a low level may be incorrectly determined as a high level. As a result, it becomes difficult or even impossible to correctly read the content of data. That is, because the serial-to-parallel conversion is performed on the basis of the out-of-synchronization clock signal, data may be incorrectly converted into parallel form. For example, data which should be converted to R0, G0, and B0 may be incorrectly converted to G0, B0, and R1.

Furthermore, in order that a VCO (voltage controlled oscillator) of the PLL can operate in a stable fashion, it is required that the voltage of a power supply should be stable enough. However, in general, fluctuations of the voltage of the power supply occur owing to noise in a logic circuit or the like, and thus the operation of the PLL become unstable. For the above reasons, use of two PLLs, one in the transmitting apparatus and the other in the receiving apparatus, results in a reduction in a margin for correct reception of data. Furthermore, in order that each PLL operates in a stable fashion, it is required that the power supply voltage should be stabilized over the entire apparatus. This results in an increase in cost.

SUMMARY OF THE INVENTION

In view of the above problems, it is an object of the present invention to provide a serial-to-parallel conversion apparatus, a semiconductor device, an electronic device, and a data transmission system, in which serial data is correctly converted to parallel data without encountering a conversion timing error in a serial-to-parallel converter thereby making it possible to correctly display an image at a receiving end.

The present invention provides:

(1) A serial-to-parallel conversion apparatus comprising: data conversion means (data computer) for sampling a first data string in the form of serial data, which includes one or more unit data strings each including a predetermined number of bits and which is input after a synchronization period, in accordance with a clock signal which has been used to generate the serial data by converting original parallel data into serial form, thereby converting the serial data to parallel data from one unit data string to another; and signal generation means (signal generator) for generating a synchronization signal corresponding to the synchronization period, on the basis of the serial data, wherein: the serial data includes a second data string for synchronization detection within the synchronization period, the second data string including one or more unit data strings each having a predetermined bit pattern; the signal generation means generates the synchronization signal when detecting the unit data string in the second data string; and the data conversion means detects the start position of the unit data string in the first data string on the basis of the synchronization signal.

In the apparatus according to (1), serial data is converted by the data conversion means to parallel data. The sampling clock signal used herein to perform the conversion of the serial data into the parallel data is the same sampling clock signal as that used in conversion from original parallel data to that serial data. Therefore, even if the clock signal used in the parallel-to-serial conversion includes jitter, no timing error occurs in the serial-to-parallel-conversion because the same clock signal is used. Furthermore, in the present invention, instead of generating a sampling clock signal on the basis of a reference clock signal (such as a dot clock signal), the synchronization signal is generated by the signal generation means by detecting the second data string in the serial data. On the basis of this synchronization signal, the position of a unit data string which appears first in the first data string is detected thereby determining the start timing of outputting the parallel data.

The present invention also provides serial-to-parallel conversion apparatus described below in (2) to (8).

(2) A serial-to-parallel conversion apparatus according to (1), wherein the bit pattern of the unit data string in the second data string is a unique pattern different from any bit pattern that unit data strings in the first data string can have.

In the apparatus according to (2), it is possible to prevent a unit data string in the first data string from being detected incorrectly as a data string in the second data string.

(3) A serial-to-parallel conversion apparatus according to (2), wherein the signal generation means (data storage device) includes data string detection means, to which the clock signal and the serial data are input, for detecting the unit data string in the second data string from the serial data thereby outputting the synchronization signal.

In the apparatus according to (3), it becomes possible to output a synchronization signal each time a unit data string in the second data string is detected from the serial data. Because the unit data string in the second data string is generated periodically, the synchronization signal is output each time the unit data string is generated.

(4) A serial-to-parallel conversion apparatus according to (3), wherein the data string detection means (data storage device) includes: data holding means for temporarily holding the serial data from one unit data string to another in accordance with the clock signal; and synchronization signal outputting means (synchronization signal outputting device) for outputting the synchronization signal when the unit data string held by the data holding means has the predetermined bit pattern.

In the apparatus according to (4), each unit data string is temporarily held by the data holding means, and the synchronization signal is output when the unit data string held by the data holding means has the same pattern as the predetermined pattern set in advance in the synchronization signal outputting means. This ensures that the second data string can be detected in a highly reliable fashion.

(5) A serial-to-parallel conversion apparatus according to (1), wherein the signal generation means includes: data string detection means, to which the clock signal and said serial data are input, for outputting an auxiliary synchronization signal each time a unit data string in the second data string is detected from the serial data; and synchronization signal outputting means for outputting the synchronization signal when detecting a plurality of auxiliary synchronization signals output from the data string detection means.

In the apparatus according to (5), it is possible to generate an auxiliary synchronization signal each time a unit data string in the second data string is detected from the serial data. Because the unit data string in the second data string is generated periodically, the synchronization signal is output each time the unit data string is generated. This makes it possible to prevent an incorrect detection of the start point of the first data string when a single auxiliary synchronization signal is generated erroneously.

(6) A serial-to-parallel conversion apparatus according to (5), wherein the data string detection means includes: data holding means for temporarily holding the serial data from one unit data string to another in accordance with the clock signal; and auxiliary synchronization signal outputting means (auxiliary synchronization signal outputting device) for outputting the auxiliary synchronization signal when the unit data string held by the data holding means has the predetermined bit pattern.

In the apparatus according to (6), each unit data string is temporarily held by the data holding means, and the auxiliary synchronization signal is output if the unit data string held by the data holding means has the same pattern as the predetermined pattern set in advance in the auxiliary synchronization signal outputting means. This ensures that the second data string can be detected in a highly reliable fashion.

(7) A serial-to-parallel conversion apparatus according to (5) or (6), wherein the signal generation means further includes period control signal generation means (prior control signal generator) for generating a period control signal whose voltage level is set to a predetermined value over a second period entirely containing a first period, from its beginning to its end, in which a plurality of auxiliary synchronization signals are successively output, and wherein the auxiliary synchronization outputting means outputs the auxiliary synchronization signal when the unit data string has the predetermined bit pattern.

In the apparatus according to (7), any auxiliary synchronization signal appears during the second period substantially corresponding to the synchronization period. Therefore, unlike the apparatus according to (4), incorrect detection of the synchronization signal does not occur even if the bit pattern of unit data strings in the second data string is not unique.

(8) A serial-to-parallel conversion apparatus according to (7), wherein the detection signal generation means (first setting device) includes: first setting means for setting the start timing of the second period in accordance with the auxiliary synchronization signal and the clock signal; second setting means (second setting device) for setting the end timing of the second period in accordance with the auxiliary synchronization signal and the clock signal; and means for controlling the voltage of the period control signal in accordance with the setting of the first and second setting means.

In the apparatus according to (8), the first setting means and second setting means set the start timing and end timing, respectively, of the second period by counting the clock signal generated after the auxiliary synchronization signal is output, thereby generating the period control signal.

The present invention also provides a semiconductor device including a serial-to-parallel conversion apparatus according to one of (1) to (8), wherein the serial-to-parallel conversion apparatus is disposed on a semiconductor substrate.

The semiconductor device may be formed in the form of a single chip on which the serial-to-parallel conversion apparatus is formed, and may be installed in various types of information processing apparatus.

The present invention also provides an electronic device including: a serial-to-parallel conversion apparatus according to one of (1) to (8); and a display unit for displaying an image in accordance with parallel data converted by the serial-to-parallel conversion apparatus.

In this electronic device, because the serial-to-parallel conversion apparatus based on one of (1) to (8) is employed, an image can be displayed on the displaying unit without encountering degradation in image quality which may otherwise occur during data transmission.

The present invention also provides a data transmission system for transferring data from a transmitting apparatus to a receiving apparatus, the transmitting apparatus comprising: an information supplying source for outputting a first clock signal and parallel data; means (second clock signal generator) for generating a second clock signal by multiplying the first clock signal; and parallel-to-serial conversion means (parallel-to-serial conversion apparatus) for sampling the parallel data in synchronization with the second clock signal and serially outputting data strings comprising unit data strings each having a period corresponding to one cycle of the first clock signal such that a second data string including one or more unit data strings each having a particular bit pattern for synchronization detection is serially output during a synchronization period and such that a first data string including one or more unit data strings is serially output during a period following the synchronization period, the receiving apparatus comprising: means for receiving the serial data (receiving device) and the second clock signal from the parallel-to-serial conversion means; signal generation means for detecting the second data string in the serial data and generating a synchronization signal corresponding to the synchronization period; serial-to-parallel conversion means (serial-to-parallel conversion apparatus) for detecting the start position of the unit data string contained in the first data string in the serial data on the basis of the synchronization signal and sampling the serial data in synchronization with the second clock signal thereby converting the serial data into parallel data from one unit data string to another.

In this data transmission system, the serial-to-parallel conversion apparatus according to (1) is disposed as the receiving apparatus. Thus, the receiving apparatus in this system also has similar advantages to those achieved by (1).

In this data transmission system, the transmitting apparatus preferably includes electric-to-optical signal conversion means (electric-to-optical signal converter) for converting the serial data in the form of an electric signal to an optical signal, wherein the electric-to-optical signal conversion means is preferably formed of a surface emitting laser.

Conventionally, semiconductor lasers of the edge emitting type are widely used in communication systems and other applications. However, edge emitting lasers have a relatively large threshold current in the range from 20 to 50 mA, and thus a large bias current is required. Another problem of edge emitting lasers is that the threshold current greatly depends on temperature, and thus it is required to control the current by way of feedback control (auto power control) while monitoring the optical output so that the optical output is maintained constant. Therefore, a special type of driver is required to use an edge emitting laser. This results in an increase in complexity of the system. In contrast, the surface emitting laser employed in the preferable mode of the system has a small threshold current in the range from 0.05 mA to 10 mA, and the temperature dependence of the threshold current can be suppressed to an extremely low level. Therefore, the surface emitting laser can be driven using a simple modulation circuit. In the simplest case which needs the lowest cost, an optical signal corresponding to an electric signal can be generated by simply connecting the surface emitting laser to the parallel-to-serial conversion apparatus.

Furthermore, because the surface emitting laser operates in the single longitudinal mode, it has high monochromaticity and high stability in terms of wavelength which allow it to be coupled with an optical fiber with a high coupling efficiency. Another advantage of the surface emitting laser is that because it emits light in a direction perpendicular to the semiconductor substrate surface, the surface emitting laser can be mounted by means of chip bonding on an integrated circuit chip such as a CMOS circuit into the form of a hybrid integrated circuit. This form needs a single package and thus a reduction in cost can be achieved. Furthermore, optical signal transmission can be performed at a high transmission rate which allows an increase in processing speed.

Furthermore, in the above data transmission system, the electric-to-optical conversion means is preferably a multi-wavelength surface emitting laser.

In this preferable mode, it is possible to dispose light emitting parts which emit light with different wavelengths at small intervals of the order of 10 $\mu$m. Therefore, light rays with various wavelengths emitted from the multi-wavelength surface emitting laser can be coupled into at least single optical transmission means with a relatively large diameter. This allows serial data and a multiplied clock signal or a plurality of serial data and a multiplied clock signal to be transmitted using the single optical transmission means.

Furthermore, in the above data transmission system, it is desirable that a transmission medium for transmitting the clock signal and the serial data be formed of a plurality of optical fibers, and the electric-to-optical signal conversion means be formed of a multi-beam surface emitting laser.

In this preferable mode, the multi-beam surface emitting laser includes the plurality of light emitting parts which are arranged in a one-dimensional or two-dimensional fashion on a semiconductor substrate chip, the light incidence ends of the plurality of optical fibers can be easily positioned with respect to the array of light emitting parts thereby coupling the multi-beam surface emitting laser with the plurality of optical fibers. This makes it possible to achieve transmission via a plurality of optical fiber at low cost.

DESCRIPTION OF THE PREFERRED EMBODIMENTS

Referring to drawings, a data transmission system, in which a serial-to-parallel conversion apparatus according to the present invention is employed, is described below in detail.

First Embodiment
(General System Configuration)

Figure 1:
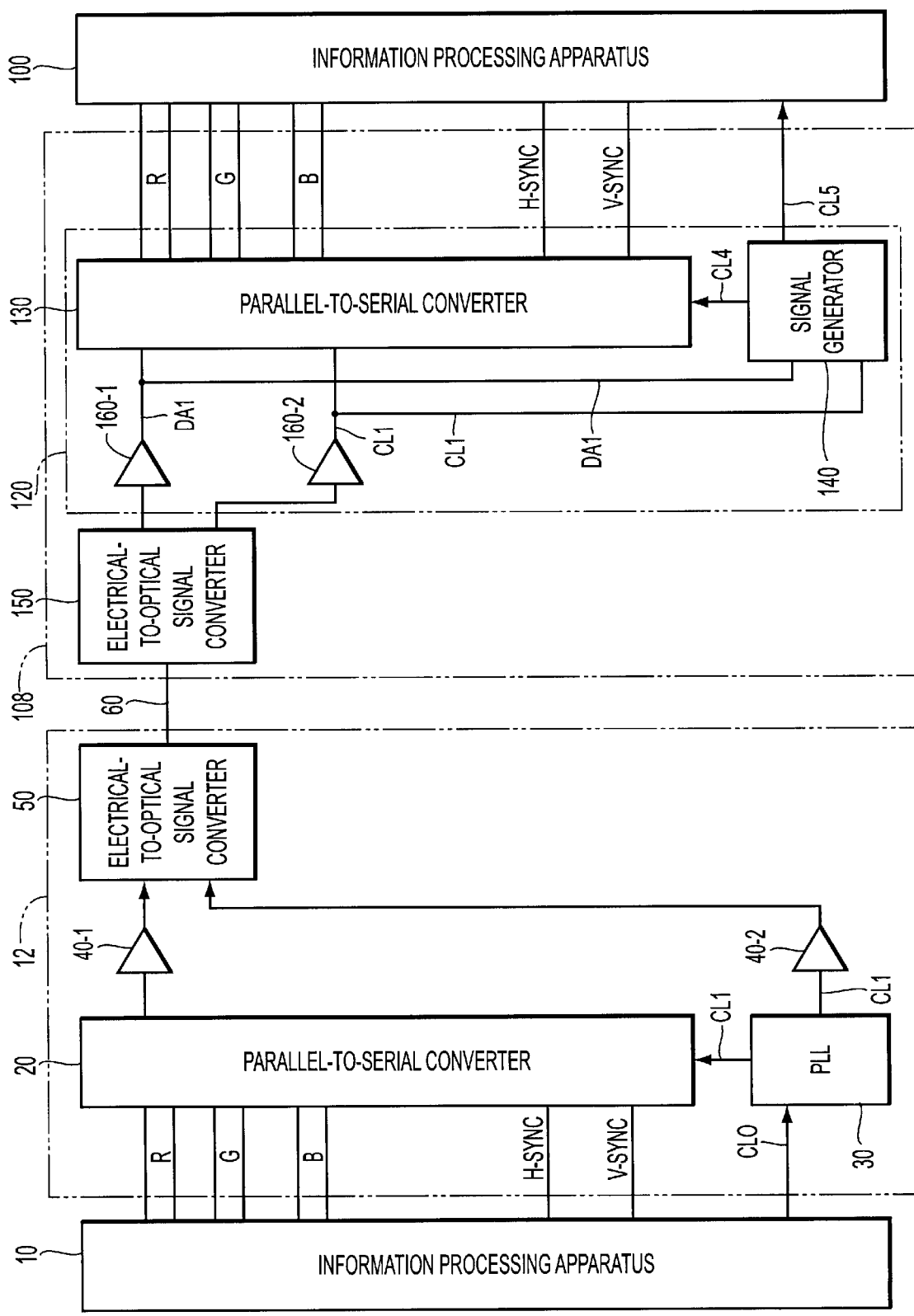
FIG. 1 is a functional block diagram illustrating the general configuration of one embodiment of a data transmission system according to the present invention.

FIG. 1 illustrates the general configuration of one embodiment of a data transmission system according to the present invention. In the data transmission system 1 of the present embodiment, communication is performed between one information processing apparatus 10 and another information processing apparatus 100 via transmission means (transmission device) 60.

In the present embodiment, one information processing apparatus 10 serves to transmit data, and the other information processing apparatus 100 serves to receive the data. A specific example of the one information processing apparatus 10 is a personal computer (PC), and examples of the other information processing apparatus 100 are a display device including a liquid crystal display panel and a portable device.

The information processing apparatus 10 is connected to a transmitting apparatus 12 including, as shown in FIG. 1, a parallel-to-serial converter 20, a phased-locked loop (PLL) 30, transmission drivers 40-1 and 40-2, and an electric-to-optical signal conversion means (electric-to-optical signal converter) 50. On the other hand, the information processing apparatus 100 is connected to a receiving apparatus 108 including a serial-to-parallel converter 130, signal generation means (signal generator) 140, receivers 160-1 and 160-2, and an optical-to-electrical signal conversion means (optical-to electric signal converter) 150. Herein, input means is formed by the receivers 160-1 and 160-2 and the optical-to-electrical signal conversion means 150.

The one information processing apparatus 10 outputs parallel data and a dot clock signal-synchronized with the parallel data. The other information processing apparatus 100 receives these signals and displays an image in accordance with them.

Examples of data transmitted between the information processing apparatus 10 and 100 are a video synchronization signal (horizontal synchronization signal H-sync, vertical synchronization signal V-sync), a video signal (R, G, B), and a clock signal. However, the present invention is not limited to these examples. The details, such as an arrangement, of data to be transmitted will be described later.

The parallel-to-serial converter 20 converts parallel data (R, G, B, H-sync, V-sync) output from the information processing apparatus 10 to one or more series of serial data. In the present embodiment, by way of example, 18-bit color video data is transmitted, wherein and thus the parallel-to-serial converter 20 has six input terminals for each of R, G, and B signals, one input terminal for each of the H-sync and V-sync signals, and one output terminal. Thus, the parallel-to-serial converter 20 has twenty terminals in total. However, the number of terminals is not limited to this example. There may be provided a plurality of output terminals as long as the number of output terminals is smaller than the number of input terminals.

A clock signal CL1 used in the above conversion process is supplied from a PLL 30 serving as a clock multiplier.

The PLL 30 generates the clock signal CL1 (multiplied clock signal) corresponding to the transmission rate of the serial data by multiplying the frequency of a dot clock signal CL0 (corresponding to the transmission rate of image information) serving as a reference clock signal. For example, when the frequency of the dot clock signal CL0 is equal to 25 MHz, this frequency is multiplied up to 500 MHz to generate the clock signal CL1 used for synchronization associated with the 18-bit color video signal.

The frequency of the clock signal CL1 may be half the above frequency 500 MHz, that is, 250 MHz, if the duty ratio thereof is 50% and if both the rising and falling edges are used in the circuit operation. Although a more complex circuit is required in this case, the reduction in the clock frequency allows circuit elements, interconnection lines, and transmission lines to operate in a lower frequency band; which is more desirable in practical applications. For simplicity, in the following discussion, we assume that the clock frequency is equal to 500 MHz, unless otherwise noted.

The drivers 40-1 and 40-2 in the transmitting unit generates a transmission signal corresponding to the serial data output from the parallel-to-serial converter 20 and also generates a transmission signal corresponding to the multiplied clock signal CL1 output from the PLL 30.

The resultant electric signals corresponding to the above data and the clock signal, respectively, are then converted to optical signals by the electrical-to-optical signal conversion means 50 and transmitted via the transmission means 60. The conversion into the optical transmission signals allows the signals to be protected from EMI and also allows them to be transmitted over a long distance. Furthermore, the receiving apparatus is not needed to perform frequency multiplication, and thus no jitter occurs in the receiving apparatus.

Preferably, the electrical-to-optical signal conversion means 50 is formed of a surface emitting laser, a multi-wavelength surface emitting laser, or a multi-beam surface emitting laser. The transmission means 60 serving as a transmission medium for transmitting the serial data is preferably formed of one or more optical fibers (plastic fibers or plastic clad optical fibers). Preferably, the total length of the transmission means 60 is about 100 m. Although in the present embodiment, one transmitting apparatus and one receiving apparatus are connected via one optical fiber serving as the transmission means 60, one transmitting apparatus and one receiving apparatus may also be connected via a plurality of optical fibers whereby data may be transmitted.

The optical-to-electrical signal conversion means 150 in the receiving apparatus converts the optical transmission signals corresponding to the received serial data and clock signal, respectively, to electrical signals. Preferably, the optical-to-electrical signal conversion means 150 is formed of a GaAs PD or the like. Alternatively, a Si pin photodiode or an InGaAs pin photodiode may be employed to form the optical-to-electrical signal conversion means 150.

The transmission system constructed in the above-described manner operates as follows. First, the horizontal synchronization signal H-sync, the vertical synchronization signal V-sync, and the RGB data output from the information processing apparatus 10 are applied to the parallel-to-serial converter 20, and the clock signal CL0 output from the information processing apparatus 10 is applied to the PLL circuit 30.

In accordance with the clock signal CL1 generated by the PLL circuit 30 by means of frequency multiplication, the parallel-to-serial converter 20 sequentially samples the parallel data (A0), ..., (Ak) input via a plurality of, for example twenty, input lines thereby generating serial data (A0 . . . Ak).

The resultant serial data is input to the electrical-to-optical signal conversion means 50 via the driver 40-1. The multiplied clock signal CL1 output from the PLL 30 is also input to the electrical-to-optical signal conversion means 50 via the driver 40-2.

After being converted into optical signals by the electrical-to-optical signal conversion means 50, the serial data and the clock signal CL1 are transmitted from the transmitting apparatus to the receiving apparatus via the transmission means 60 formed of, for example, two optical fibers.

If the receiving apparatus receives the optical signals of the serial data and the clock signal via the transmission means 60, the optical signals are reconverted to electrical signals by the optical-to-electrical signal conversion means 150 disposed in the receiving apparatus.

The serial data output from the optical-to-electrical signal conversion means 150 is input as serial data DA1 to the serial-to-parallel converter 130 and the signal generation means 140 via the receiver 160-1.

On the other hand, the clock signal CL1 output from the optical-to-electrical conversion means 150 is input to the serial-to-parallel converter 130 and the signal generation means 140 via the receiver 160-2.

(Serial-to-Parallel Conversion Apparatus)

The serial-to-parallel conversion apparatus 120 is a part essential to the present invention. As shown in FIG. 1, the serial-to-parallel conversion apparatus 120 is constructed in the form of a single-chip integrated circuit including the serial-to-parallel converter 130, the signal generation means 140, and the receivers 160-1 and 160-2 all formed on a semiconductor substrate.

The serial-to-parallel converter 130 serving as the data conversion means (data converter) converts serial data received via the receiver 160-1 to parallel data (video synchronization signals (horizontal synchronization signals H-sync, vertical synchronization signal V-sync), video signals (R, G, B)) in accordance with the multiplied clock signal CL1 generated by the transmitting apparatus and in accordance with the second auxiliary synchronization signal CL4. The resultant parallel data is sent to the information processing apparatus 100.

The serial-to-parallel converter 130 may be configured in various manners. Two preferable examples of the configuration are shown in FIGS. 4 and 5, respectively.

Figure 4:
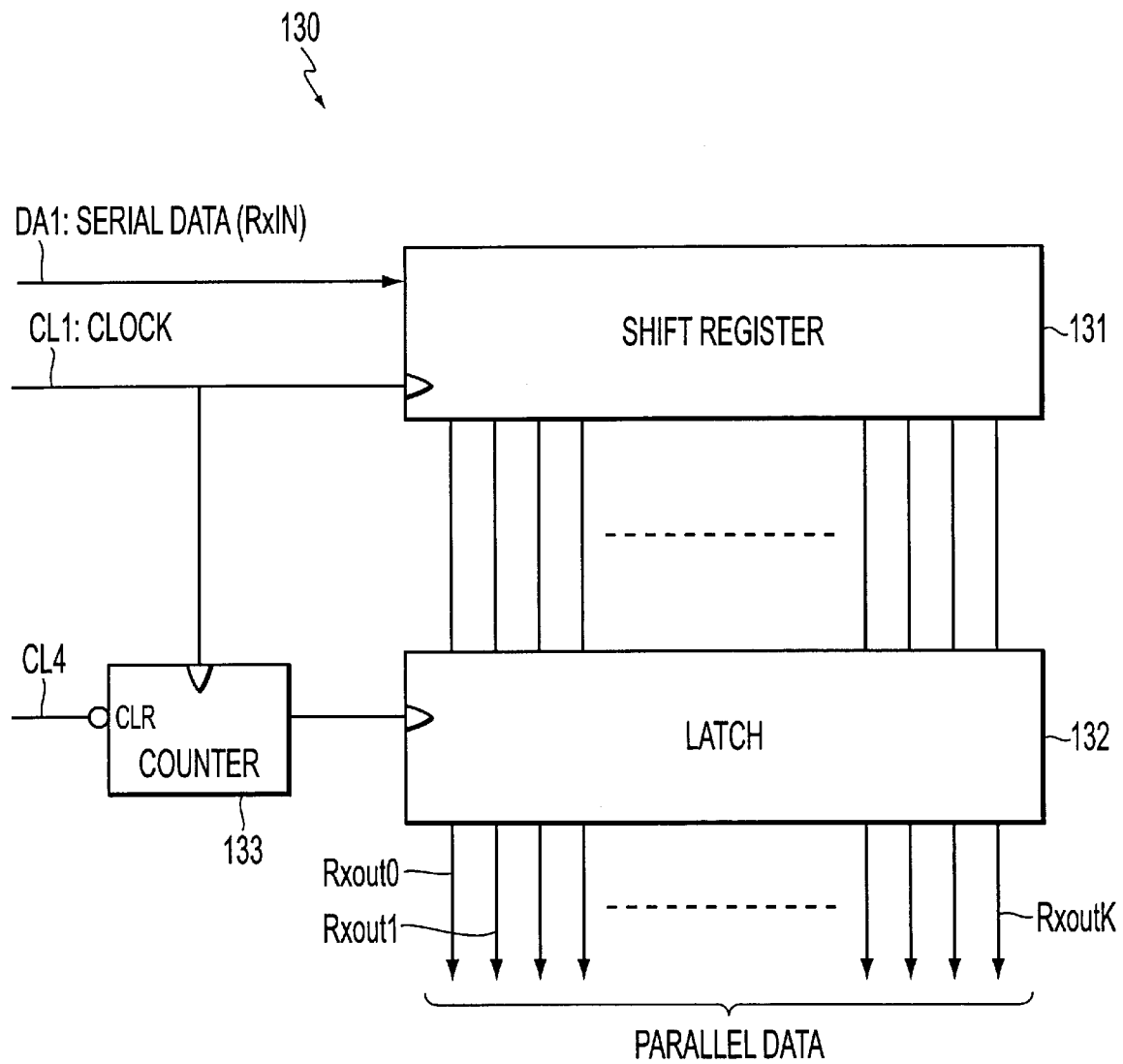
FIG. 4 is a block diagram illustrating a specific example of a serial-to-parallel converter shown in FIG. 1.
Figure 5:
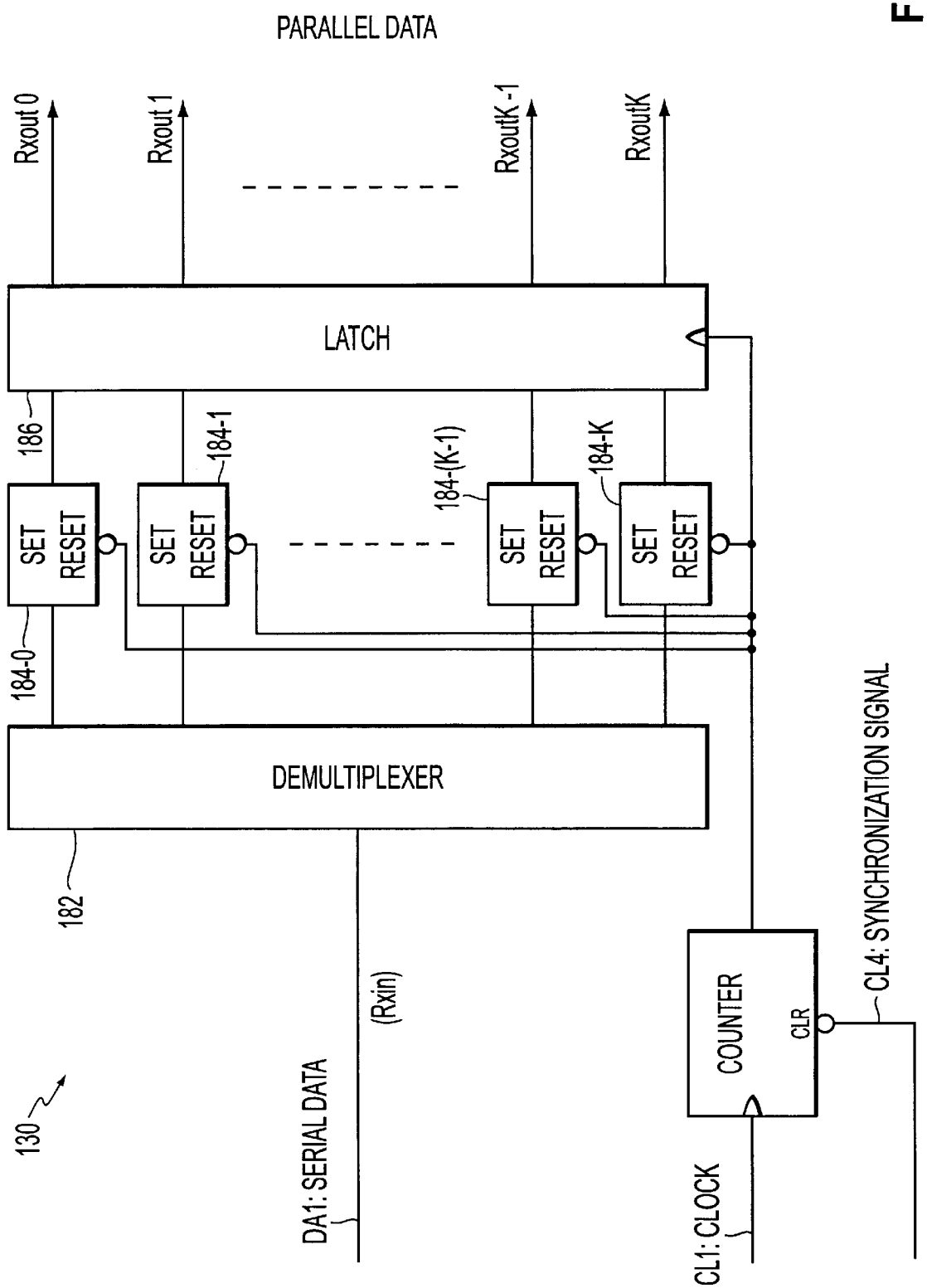
FIG. 5 is a block diagram illustrating another specific example of the serial-to-parallel converter shown in FIG. 1.

In the example shown in FIG. 4, the serial-to-parallel converter 130 includes: a shift register 131 serving as data holding means (storage device) for holding serial data (Rxin) in accordance with the clock signal CL1; a counter 133 serving as counting means which operates in accordance with the second auxiliary synchronization signal CL4 and the clock signal CL1; and a latch circuit 132 for outputting parallel data (Rxout0–Rxoutk) in accordance with the outputs of the counter 133 and the shift register 131. In this configuration, the serial-to-parallel converter 130 converts the sequentially-input serial data Rxin to parallel data in accordance with the timing specified by the output of the counter 133 and outputs the resultant parallel data Rxout0–Rxoutk. The second auxiliary synchronization signal CL4 resets the counter 133 so that serial data is converted to parallel data at correct timing points.

In the example shown in FIG. 5, the serial-to-parallel converter 130 includes: a demultiplexer 182 serving as data conversion means (data converter) for converting input serial data DA1 to parallel data; a counter 188 serving as counting means which operates in accordance with the clock signal CL1 and a second auxiliary synchronization signal CL4 which will be described later; a plurality of SR flip-flops 184 (184-1 to 184-K) which are reset by the output of the counter 188 so as to control the outputting of data from a plurality of output terminals of the demultiplexer 182; and a latch circuit 186 for latching and outputting the outputs of the SR flip-flops 184 (184-1 to 184-K) in response to the output of the counter 188. Also in this configuration, sequentially-input serial data Rxin is converted to parallel data Rxout0–Rxoutk in accordance with the timing specified by the output of the counter 188. The second auxiliary synchronization signal CL4 resets the counter 188 so that serial data is converted to parallel data at correct timing points.

(Serial Data)

In the present invention, the term serial data is used to describe data comprising a plurality of unit data strings each comprising a plurality of serial bits. For example, each unit data string comprising bits representing one pixel of video signal and further one bit for horizontal synchronization and another one bit for vertical synchronization (a total of two bits for synchronization). Thus, in the case where an 18-bit color image is displayed, each unit data string comprising 2 bits (for vertical and horizontal synchronization)+18 bits (representing R, G, and B intensity levels)=20 bits. In each 20-bit unit data string, for example, most significant 2 bits are assigned to the vertical and horizontal synchronization, and the remaining lower-order 18 bits are assigned to the R, G, and B intensity levels wherein 6 bits of the lower-order 18 bits are used for each of the R, G, and B intensity levels. In the case where a 24-bit color image is displayed, each unit data string comprising 2+24=26 bits. In this case, for example, most significant 2 bits of each 26-bit unit data string are assigned to the vertical and horizontal synchronization, and the remaining lower-order bits are assigned to the R, G, and B intensity levels wherein 8 bits are used for each of the R, G, and B intensity levels.

More specifically, the number of pixels of one frame of image, the frequency of the dot clock signal, and the video signal transmission rate are given as shown in the following table.

| Number of Pixels | | Dot Clock | | 18-Bit Color | | 24-Bit Color | |
|---|---|---|---|---|---|---|---|
| VGA | 640 × 480 | 25 | MHz | 500 | Mbps | 650 | Mbps |
| SVGA | 800 × 600 | 40 | MHz | 800 | Mbps | 1.04 | Gbps |
| XGA | 1024 × 768 | 65 | MHz | 1.3 | Gbps | 1.69 | Gbps |
| SXGA | 1280 × 1024 | 135 | MHz | 2.7 | Gbps | 3.51 | Gbps |

That is, in the case of 18-bit color images, the transmission rate (in bps) becomes equal to 20 times the dot clock rate. On the other hand, the transmission rate for 24-bit color images, the transmission rate becomes equal to 26 times the dot clock rate.

If the frequency of the dot clock signal CL0 is equal to, for example, 25 MHz, the clock signal CL1 having a frequency of 500 MHz for the 20-bit unit data string is produced by multiplying the frequency of the dot clock signal CL0 by a factor of 20.

In the following description, by way of example, 20-bit parallel data input is serially transmitted from the transmitting apparatus 10 via the single transmission line 60, although the parallel data may also be serially transmitted via a plurality of transmission lines.

Figure 6:
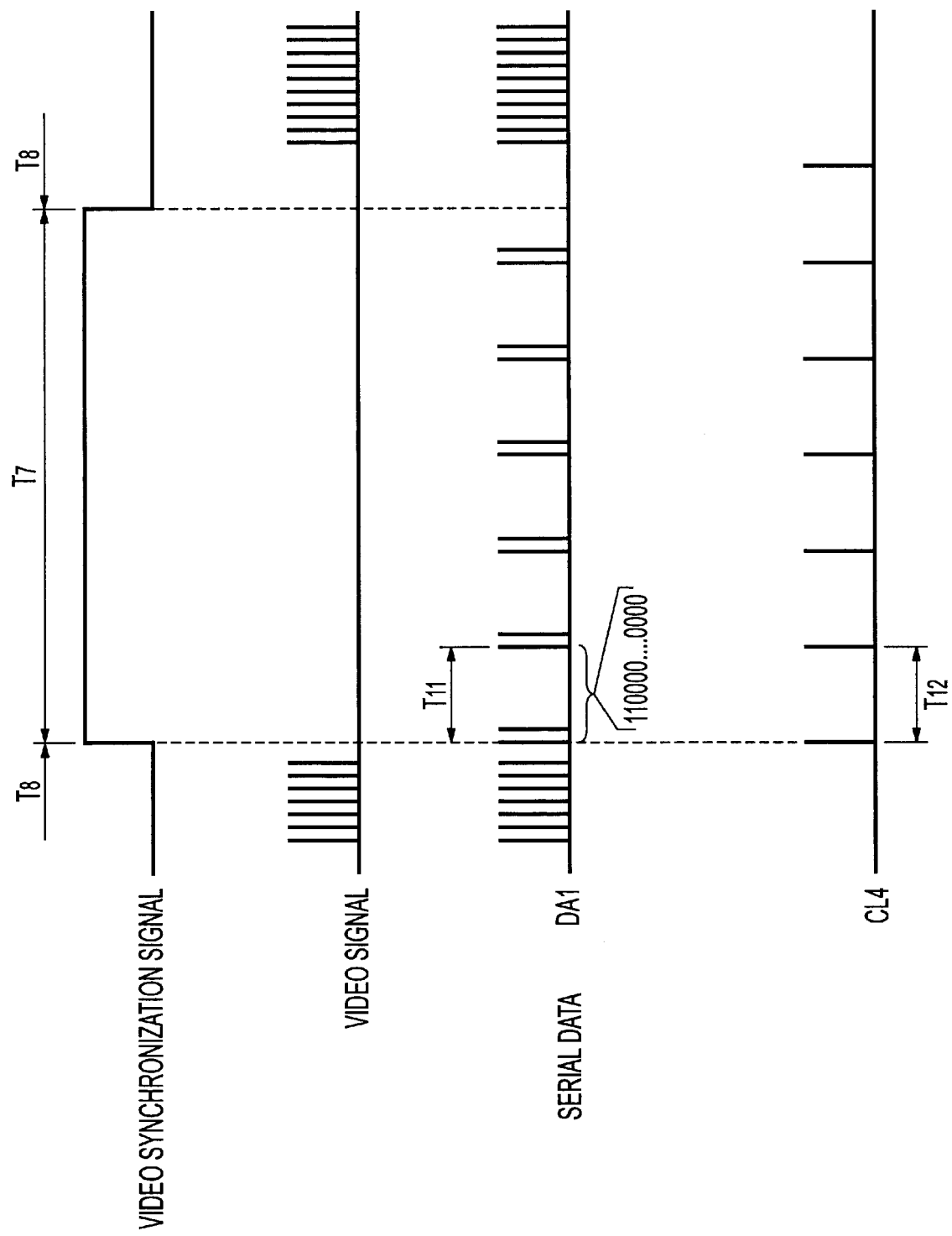
FIG. 6 is a timing chart illustrating an example of the operation of the signal generation means configured as shown in the block diagram of FIG. 2.
Figure 9:
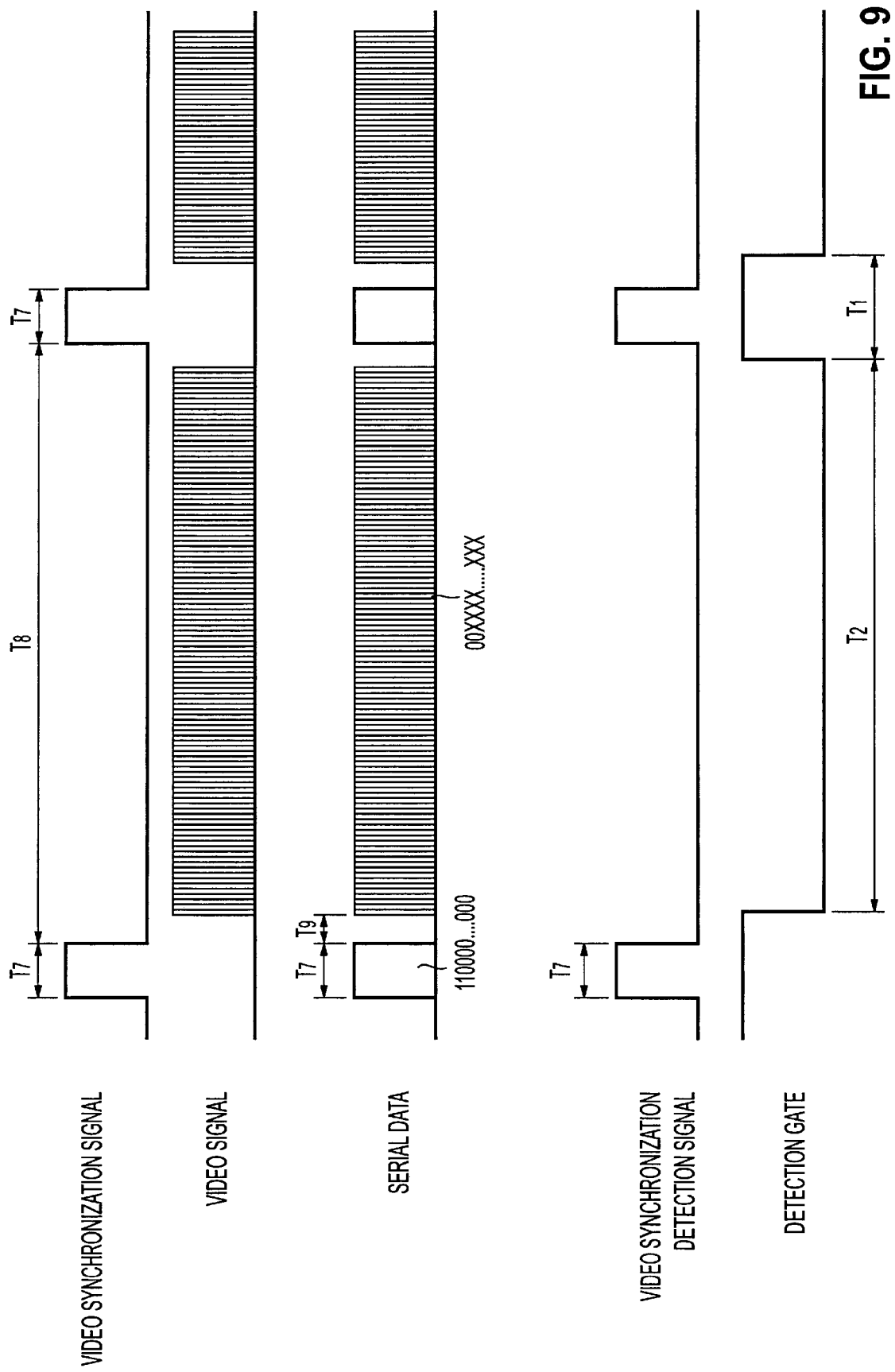
FIG. 9 is a timing chart illustrating an example of the operation of the signal generation means configured as shown in the block diagram of FIG. 2.

In the case where each unit data string is composed of 20 bits, the operation is performed as follows. In FIGS. 6 and 9, serial data has a value "00XXXX . . . XXXX" in each effective video period T8 wherein the most significant 2 bits are both "0" and the remaining lower-order 18 bits XXXX . . . XXXX have values corresponding to the R, G, and B intensity levels. One or more unit data strings are placed in each period T8 shown in FIG. 9. Hereinafter, the data string comprising the one or more unit data strings in the period T8 is referred to as a first data string. On the other hand, in each video synchronization period T7 shown in FIGS. 6 and 9, the most significant 2 bits of each unit data string are both "1", and the remaining lower-order bits are all "0". That is, the unit data string in this period has a pattern "110000 . . . 0000" which is used to detect a start position in the operation of converting the serial data into parallel form. Also in this period T7 shown in FIG. 9, one or more unit data strings are placed, and hereinafter the data string comprising the one or more unit data strings in this period is referred to as a second data string.

Herein, the video synchronization period T7 refers to either one of or both of the vertical synchronization period and the horizontal synchronization period. In the present invention, the signal indicating the start position is not necessarily needed in all vertical and horizontal synchronization periods. For example, the signal indicating the start position may be placed only in the first one or more synchronization periods of a plurality of frames which are successively transmitted. In this case, a unit data string indicating an ordinary vertical or horizontal synchronization period is placed in any video synchronization period T7 which is not used to detect the start position. For example, a unit data string whose first bit is "1" and the remaining 19 bits are all "0" is used to indicate a vertical synchronization period, and a unit data string whose second bit is "1" and the other 19 bits are all "0" is used to indicate a horizontal synchronization period.

(Signal Generation Means)

The detailed configuration of the signal generation means 140 is now described below with reference to FIGS. 2 and 3.

Figure 2:
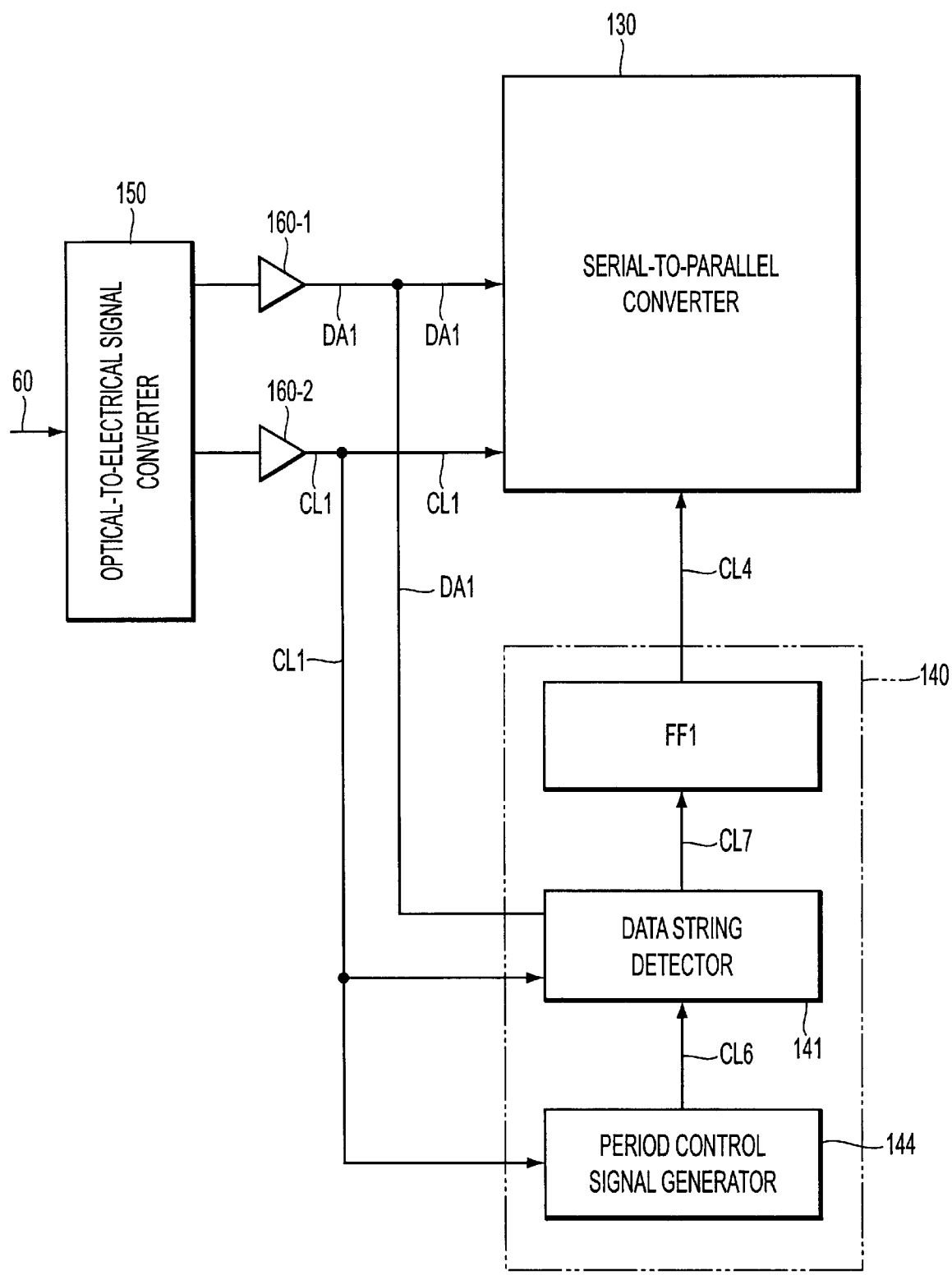
FIG. 2 is a block diagram illustrating the details of signal generation means of the system shown in FIG. 1.

As shown in FIG. 2, the signal generation means 140 includes data string detection means (data converter) 141 for outputting the first auxiliary synchronization signal CL7; a flip-flop FF1 serving as synchronization signal outputting means for outputting the second auxiliary synchronization signal CL4 in accordance with the first auxiliary synchronization signal CL7; and period control signal generation means (period control signal generator) 144 for supplying a period control signal CL6 to the data string detection means 141.

Figure 3:
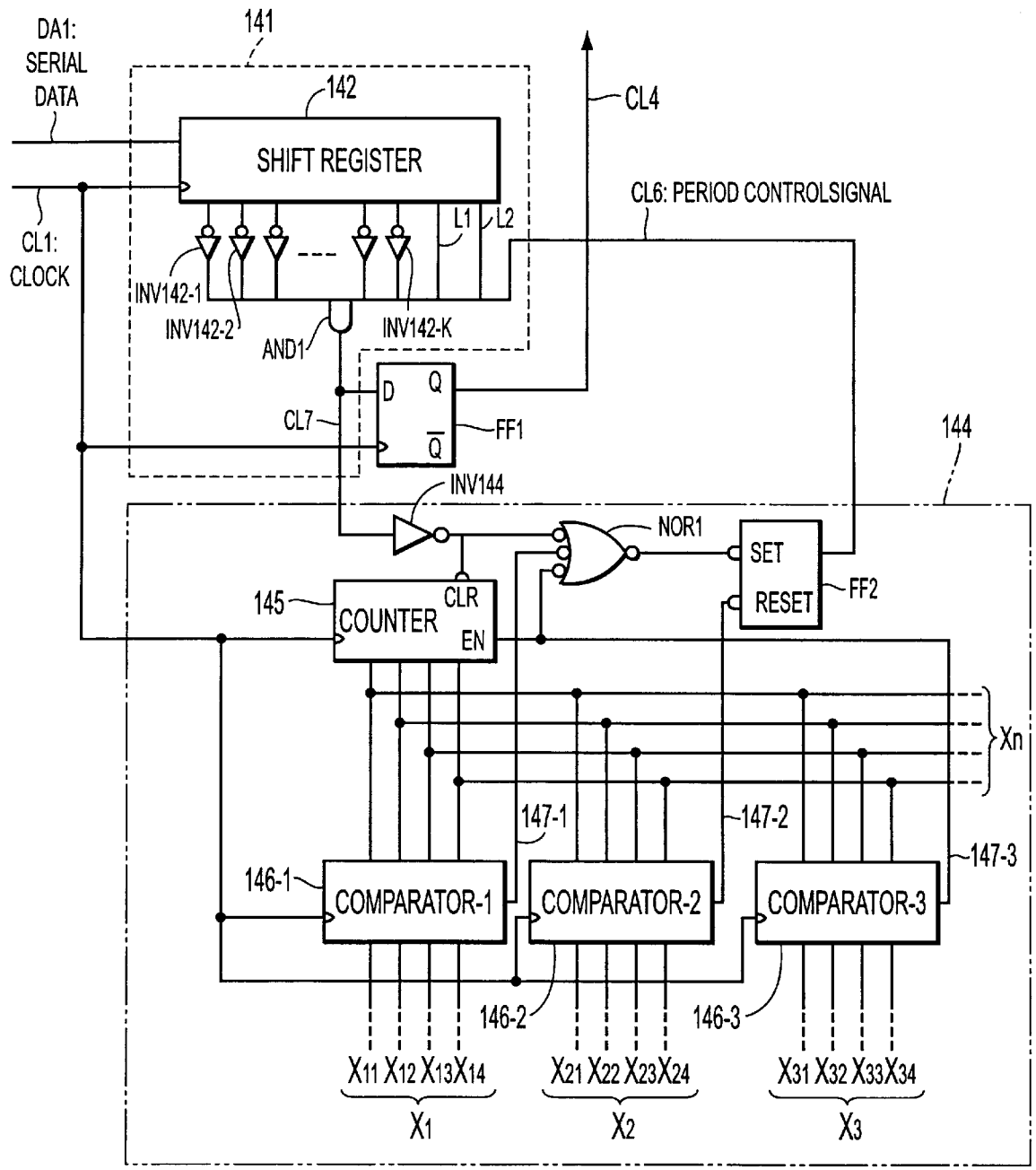
FIG. 3 is a circuit diagram illustrating the details of the signal generation means shown in FIG. 1.

The data string detection means 141 includes, as shown in FIG. 3, a shift register 142 serving as data holding means for temporarily holding each unit data string (comprising W bits (20 bits, for example)) of the serial data DA1 in response to the clock signal CL1.

The data string detection means 141 also includes a plurality of inverters INV141 (142-1 to 142-K) for inverting the voltages of the respective bits of the unit data string output at the same time via k lines from the shift register 142, except for the two highest-order bits. That is, K (=W−2=18) bits are inverted by these inverters.

The data string detection means 141 further includes an AND gate AND1 to which the two highest-order bits of the unit data string stored in the shift register 142 are input via output lines L1 and L2 and also the period control signal CL6 output from the period control signal generation means 144 and the outputs of the plurality of inverters INV142-1 to 142-K are input.

The flip-flop FF1 serving as the synchronization signal outputting means (synchronization signal outputting device) outputs the second auxiliary synchronization signal CL4 in accordance with the first auxiliary synchronization signal CL7 output from the AND gate AND1. In this configuration, the flip-flop FF1 outputs the second auxiliary synchronization signal CL4 only when the unit data string held in the shift register 142 has a predetermined pattern (11000 . . . 000) and the period control signal CL6 is "1". In the present embodiment, the inverters INV142-1 to 142-K, the lines L1 and L2, and the AND gate AND1 form auxiliary synchronization signal outputting means (auxiliary synchronization signal outputting device).

The flip-flop FF1 serving as the synchronization signal outputting means is disposed to remove glitches which area generated at boundaries of data by the shift register 142 and the AND gate AND1. Like the first auxiliary synchronization signal CL7, the second auxiliary synchronization signal is output one by one.

In the present embodiment, the flip-flop FF1 outputs the second auxiliary synchronization signal CL4 in response to the first auxiliary synchronization signal CL7. In the present embodiment, although not show in FIG. 3, there is preferably provided a counter for counting the second auxiliary synchronization signal CL4. The counter counts up the number of second auxiliary synchronization signals corresponding to a synchronization period T7 and outputs a synchronization signal used to detect the start position of the video signal.

In this case, the synchronization signal outputting means includes, in addition to the flip-flop FF1, the counter (not shown) for counting the second auxiliary synchronization signals CL4 and means for outputting one synchronization signal used to detect the start position of the video signal each time a plurality number of second synchronization signals CL4 are detected on the basis of the output of the counter.

This makes it possible to prevent a synchronization signal from being erroneously output when a single first auxiliary synchronization signal is erroneously output, as will be described later.

When the period during which a plurality of first auxiliary synchronization signals CL7 are successively output is referred to as a first period (T7 in FIG. 7) and a period including the entire first period from its beginning to its end is referred to as a second period (T1 in FIG. 7), the period control signal CL6 generated by the period control signal generation means 144 has a predetermined voltage level over the second period T1.

The AND gate AND1 in the data string detection means 141 outputs the first auxiliary synchronization signal CL7 only when the period control signal CL6 is at a "1" level.

In the present embodiment, as described above, when in addition to the first condition associated with the predetermined pattern, the second condition that the period control signal CL6 is at the high level is satisfied, the first auxiliary synchronization signal CL7 becomes "1", and, in response, the flip-flop FF1 outputs the second auxiliary synchronization signal CL4. The first period T7 serves as a gating signal for outputting the second auxiliary synchronization signal CL4. Therefore, the method employed in the present embodiment is referred to as a detection-gating method.

Figure 7:
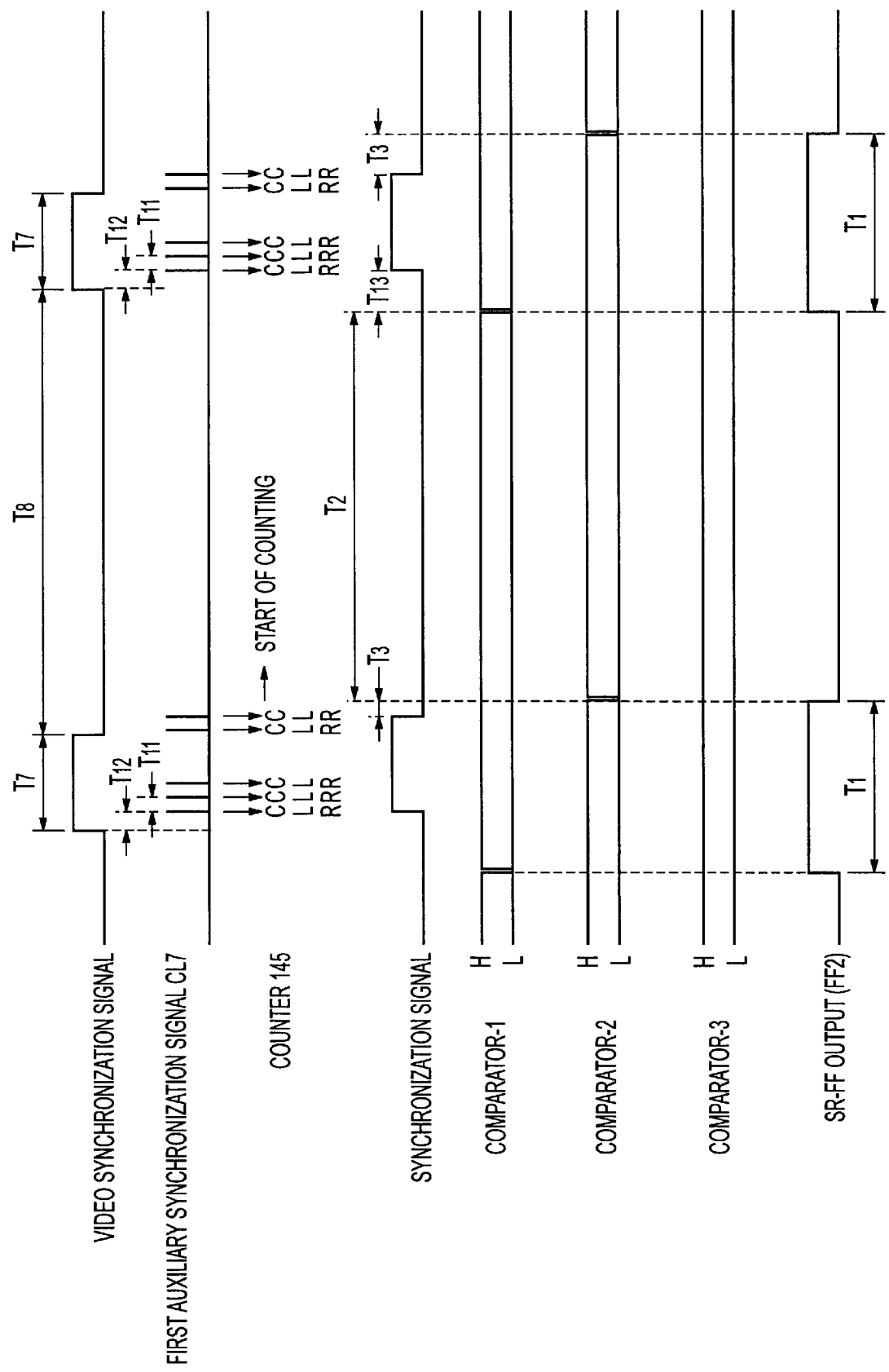
FIG. 7 is a timing chart illustrating an example of the operation of the circuit shown in FIG. 3.

In accordance with the clock signal CL1 and the first auxiliary synchronization signal CL7, as shown in FIG. 3, the period control signal generation means 144 raises its output to the high level and maintains it at that level over the predetermined period (T1) as is represented by the SR-FF output (video synchronization detection signal) in FIG. 7 thereby controlling the second auxiliary synchronization signal CL4 such that the second auxiliary synchronization signal CL4 is allowed to be output only during the period T1.

More specifically, the period control signal generation means 144 includes: an inverter INV144 to which the output CL7 of the AND gate AND1 is input; a counter 145 serving as counting means which is reset by the output of the inverter INV144 into a CLR (clear) state and which performs a counting operation in accordance with the clock signal CL1; a comparator 1 serving as first setting means (first setting device) which operates in accordance with the clock signal CL1 and the count value of the counter 145 such that an output signal 147-1 is output when the count value reaches a preset value X1 (X11 EX12 E X13 E X14); a comparator 2 serving as second setting means (second setting device) which operates in accordance with the clock signal CL1 and the count value of the counter 145 such that an output signal 147-2 is output when the count value reaches a preset value X2 (X21 E X22 E X23 E X24); a comparator 3 serving as third setting means (third setting device) which operates in accordance with the clock signal CL1 and the count value of the counter 145 such that an output signal 147-3 is output when the count value reaches a preset value X3 (X31 E X32 E X33 E X34); a NOR gate NOR1 to which the output signal 147-1 of the comparator 1, the output signal 147-3 of the comparator 3, and the output of the inverter INV144 are input; and an SR flip-flop FF2 which is set by the output of the NOR gate NOR1 into a SET state and rest by the output signal 147-2 of the comparator 2 into a RESET state and which outputs the period control signal CL6.

The comparator 1 serves to determine the start timing of the period T1 shown in FIG. 7, and the comparator 2 serves to determine the end timing of the period T1 shown in FIG. 7. Thus, the preset value X1 associated with the comparator 1 is preferably set to a value equal to the count value corresponding to the periods T2+T3 shown in FIG. 7, and the preset value X22 associated with the comparator 2 is preferably set to a value equal to the count value corresponding to the period T3 shown in FIG. 7.

On the other hand, the preset value X3 associated with the comparator 3 is set to a value which causes the output voltage to become low when a period equal to T3+T2+T1 shown in FIG. 7 has elapsed after the counter 145 started the counting operation.

More specifically, if the count value of the counter 145 reaches the preset value X3, the output signal 147-3 of the comparator falls down to the low level. The counter 145 performs a counting operation when its enable input EN is at a high level. The counter 145 stops the counting operation when the enable input EN becomes low and holds the count value. When the counter 145 holds the count value at X3, the output signal 147-3 falls down to the low level, and the period control signal CL6 is maintained at the high level.

Herein, if the synchronization pattern is detected in the serial data, the counter is reset by the inverter INV44, and the counter restarts the counting operation.

In order to control the operation more precisely, N comparators serving as setting means for setting the period may be connected to the counter 145 via output lines Xn.

(Operations of the Signal Generation Means, Data String Detection Means, and Synchronization Signal Outputting Means)

The operations of the serial-to-parallel conversion apparatus and the signal generation means in the data processing system are described below with reference to FIGS. 1, 3, 7, and 8.

The clock signal CL1 output from the optical-to-electrical signal conversion means 150 is input to the serial-to-parallel converter 103 via the receiver 160-2. The clock signal CL1 is also input to the signal generation means 140.

In accordance with the clock signals CL4 and CL1 supplied from the signal generation means 140, the serial-to-parallel converter 130 converts the serial data DA1 to parallel data R, G, B, H-sync, and V-sync and outputs the resultant data.

The output data R, G, B, H-sync, and V-sync are input to the information processing apparatus 100 disposed at the transmitting end. The clock signal CL5 output from the signal generation means 140 is also input to the information processing apparatus 100.

Now, the operation of the signal generation means 140 is described below. The serial data DA1 and the clock signal CL1 are input to the signal generation means 140. As shown in FIG. 3, the serial data DA1 is first input to the shift register 142 of the data string detection means 141 disposed in the signal generation means 140.

The shift register 142 holds the serial data from one unit data string (comprising, for example, 20 bits) to another. The lower-order 18 bits of the output signal of the shift register 142 are applied to input terminals of the AND gate AND1 via the inverters INV142-1, . . . , INV142-K, respectively, and the most significant 2bits are applied to input terminals of the AND gate AND1 via lines L1 and L2.

Thus, only when the output signal of the shift register 142 has a pattern 11000 . . . 000 (20 bits) and the period control signal CL6 is at the high level, the signal level at the output terminal of the AND gate AND1 becomes high.

The output signal of the AND gate AND1 is applied to the D-input terminal of the flip-flop FF1 and also to the inverter INV144.

In response, the flip-flop FF1 outputs the second auxiliary synchronization signal CL4 via the Q output terminal. That is, the second auxiliary synchronization signal CL4 with the high level is output only when the period control signal CL6 is at the high level and the unit data string has the pattern 11000 . . . 000 (20 bits).

The most significant 2 bits of the unit data string are used to indicate that the unit data string is a video synchronization signal (vertical synchronization signal H-sync or vertical synchronization signal V-sync), and the lower-order 18 bits indicate intensity levels (R, G, and B) of the video signal.

Therefore, when the most significant 2 bits are at the high level (that is, when the video synchronization signal is enabled), the lower-order 18 bits are meaningless. In this case, therefore, the lower-order 18 bits of each unit data string of the second data string in the video synchronization period T7 shown in FIG. 6 are all set to the low level so that the unit data string has the predetermined bit pattern. However, there is a possibility that, during the period T8 shown in FIG. 6 in which the video synchronization signal is disabled, some unit data string can have a pattern comprising 18 low-level bits following first two high-level bits.

To avoid a problem, the period control signal CL6 is raised to the high level only during the period T1 containing the period T7 during which the video synchronization signal is enabled (at the high level) thereby assuring that the second auxiliary synchronization signal CL4 is output from the signal generation means 140 only during the period T1.

That is, the period control signal CL6 output from the SR flip-flop FF2 is raised to the high level immediately before the video synchronization signal rises to the high level and maintained at that level until the video synchronization signal has fallen down to the low level (that is, during the period T1 shown in FIG. 7) thereby assuring that the output of the AND gate AND1 shown in FIG. 3 becomes high only when the period control signal CL6 is high and thus the second auxiliary synchronization signal CL4 is output only when during this period.

During the period T7 in which the video synchronization signal is at the high level, a unit data string having a pattern "11000 . . . 00" (20 bits) appears in the serial data at a plurality of times (six times in the example shown in FIG. 6) at intervals of T11. In this case, if the flip-flop FF1 and other circuit elements are configured as in FIG. 3, the second auxiliary synchronization signal CL4 is output after a delay of T12 (one clock cycle) shown in FIGS. 6 and 7 with respect to the first bit of the unit data string "11000 . . . 00" (20 bits) appearing first in the second data string during the period T7.

As a result, the first auxiliary synchronization signal CL7 corresponding to each unit data string "11000 . . . 00" (20 bits) in the period T7 is output after a delay of T12 with respect to the beginning of the period T7. However, because first auxiliary synchronization signals are output at intervals of T11 which are equal to intervals at which unit data strings "11000 . . . 00" (20 bits) are output, the start timing of the video signal period T8 is precisely reflected in the rising-up timing of the second auxiliary synchronization signal CL4.

As described above, unit data strings "11000 . . . 00" (20bits) within the period T7 are detected from the serial data, and the second auxiliary synchronization signal CL4 is output in response of detection of the unit data strings. Thus, in the operation in which the serial-to-parallel converter 130 converts serial data comprising a plurality of unit data strings to parallel data, the position of the first bit of the video signal in the period T8 is detected on the basis of the output of the second auxiliary synchronization signal CL4, and the detected first bit of the video signal is output via, for example, the terminal RXout1. Thus, the serial data is correctly converted to parallel data.

At a time when a predetermined number of second auxiliary synchronization signals CL4, which are generated at intervals of T11, have been detected, serial-to-parallel conversion is performed.

In the present embodiment, unit data strings "11000 . . . 00" (20 bits) used to indicate the start position can be generated in the transmitting apparatus 12, because the horizontal synchronization signal H-sync and the vertical synchronization signal V-sync are input to the parallel-to-serial converter 20 in the transmitting apparatus 12 shown in FIG. 1.

(Operation of Generating the Period Control Signal)

The operation of generating the period control signal CL6 is described below.

First, a first auxiliary synchronization signal CL7 output from the AND gate AND1 via its output terminal and a clock signal CL1 are input to the period signal generation means 144.

The first auxiliary synchronization signal CL7 is applied to the inverter INV144, and the output signal of the inverter INV144 is applied to the CLR terminal of the counter 145. Therefore, when the first auxiliary synchronization signal CL7 is at the high level, the counter 145 is cleared, as can be seen from the timing chart shown in FIG. 7. In FIG. 7, the counter 145 is cleared each time the first auxiliary synchronization signal CL7 rises to the high level.

After being cleared, the counter 145 counts the clock signal CL1. If the count value of the counter 145 reaches a predetermined value corresponding to a period of T3 shown in FIG. 7, the output of the comparator-2 (146-2) falls down to the low level.

The output signal of the comparator-2 (146-2) is applied to the RESET input terminal of the SR flip-flop FF2, and thus the period control signal CL6 output from the SR flip-flop FF2 falls down to the low level as shown in FIG. 7. The falling-down of the period control signal CL6 defines the end of the second period T1 shown in FIG. 7.

The counter 145 further counts the clock signal CL1. When the count value reaches a value corresponding to the period (T3+T2) shown in FIG. 7, the output of the comparator-1 (146-1) falls down to the low level. As a result, the SR flip-flop FF2 is set into a SET state via the NOR gate NOR1, and thus the period control signal CL6 output from the SR flip-flop FF2 rises to the high level. The rising-up of the period control signal CL6 defines the start of the second period T1 shown in FIG. 7.

Thereafter, the above operation is performed repeatedly. Thus, as shown in FIG. 7, the period control signal CL6 output from the SR flip-flop FF2 becomes high during each second period T1 containing the entire length of a first period T7, from its beginning and to its end, during which the video synchronization signal is enabled.

As described above, the period control signal CL6 is made high over each period T1 by the comparator-1 (146-1) and the comparator-2 (146-2).

Figure 8:
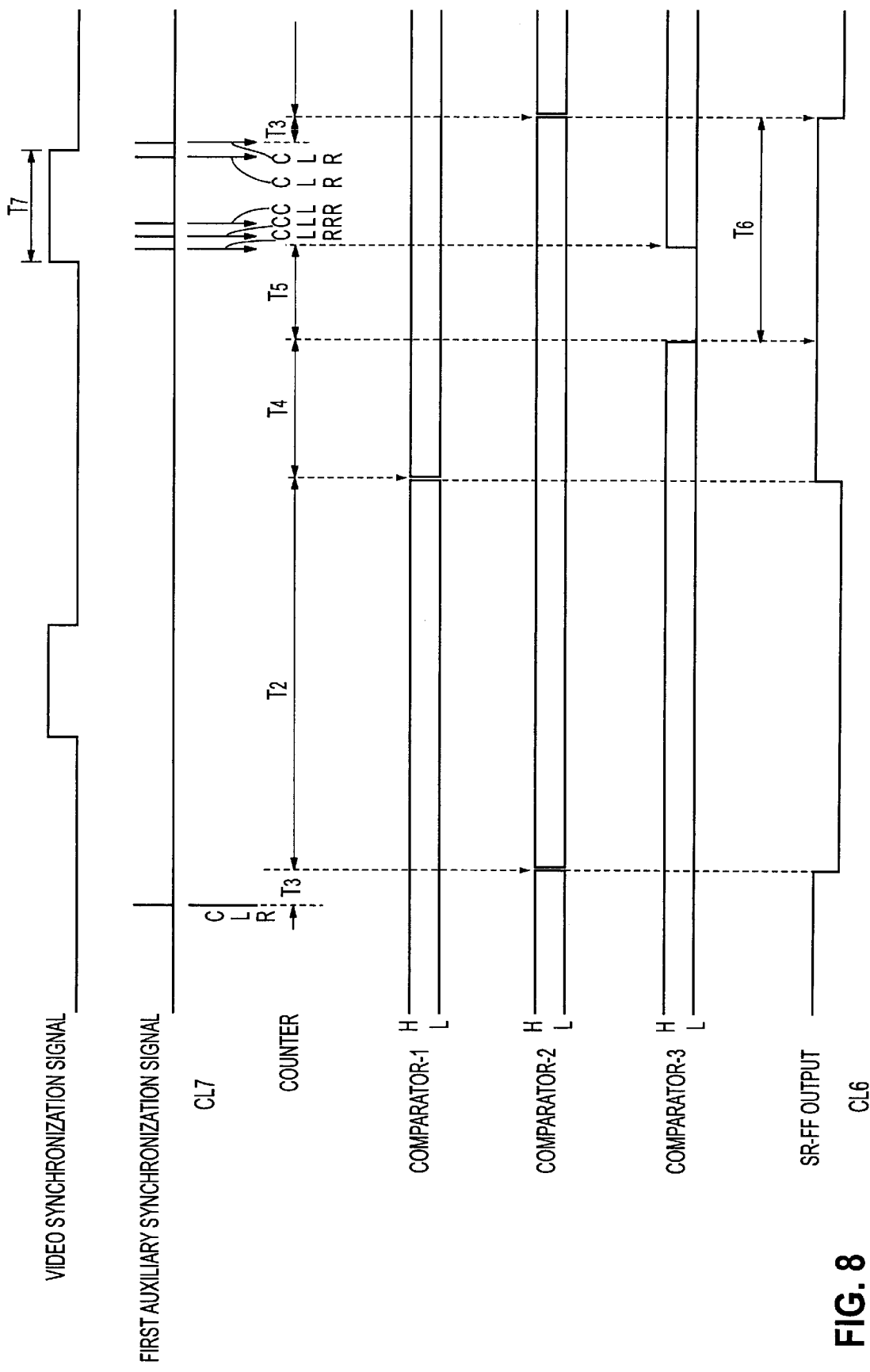
FIG. 8 is a timing chart illustrating an example of the operation of the circuit shown in FIG. 3.

There is a chance, as shown in FIG. 8, that a certain unit data string of the video signal has a pattern same as the predetermined pattern 11000 . . . 000 (20 bits) after the output of the comparator-1 became low. In this case, the counter 145 is reset (cleared), and the output of the comparator-2 becomes low when a period of T3 has elapsed since the counter 145 was reset. As a result, the period control signal CL6 becomes high during a period other than the period T7, and a unit data string having the predetermined pattern 11000 . . . 000 (20 bits) is detected during that period other than the period T7. Thus, a first auxiliary synchronization signal CL7 is output from the AND gate AND1. However, the possibility is extremely low that the pattern (11000 . . . 000) appears in successive unit data strings, and thus there is substantially no possibility that two or more first auxiliary synchronization signals CL7 are successively output. Therefore, when the count value of the counter 145 reaches a value corresponding to the period T3, the output of the comparator-2 (146-2) becomes low as shown in FIG. 8. Thus, the period control signal CL6 (output from the SR flip-flop FF2 ) soon returns to the low level.

Then, after T3+T2, the output of the comparator-1 (1461-) becomes low.

If the count value of the counter 145 reaches a predetermined value (corresponding to T3+T2+T4 shown in FIG. 8), the output of the comparator-3 (146-3) becomes high (the signal line 147-3 becomes low). As a result, the comparator-3, instead of the comparator-1, sets the SR flip-flop FF2 via the NOR gate NOR1 thereby raising the period control signal CL6 to the high level. If the count value of the counter 145 reaches a preset value X3 and the output of the comparator-3 becomes low, the enable input EN of the counter 145 becomes low, and thus the counter 145 stops its operation and the count value of the counter 145 is maintained at X3. As a result, the period control signal CL6 is further maintained at the high level over the following period T5 shown in FIG. 8. After the period T5, unit data strings 11000 . . . 000 (20 bits) serving as correct signals indicating the start position are detected, and the start position detecting operation restarts in a normal manner.
(Electric-to-Optical Conversion Means)

The details of the electric-to-optical conversion means 50 are described below. In FIG. 1, the electric-to-optical signal conversion means 50 in the transmitting apparatus is formed of, for example, a surface emitting laser, and more preferably, a multi-wavelength surface emitting laser or a multi-beam surface emitting laser.

Conventionally, semiconductor lasers of the edge emitting type are widely used in communication systems and other applications. However, edge emitting lasers have a relatively large threshold current in the range from 20 to 50 mA, and it is required that a large bias current be supplied. Another problem of edge emitting lasers is that the threshold current greatly depends on temperature, and thus it is required to control the current by means of feedback control (auto power control) while monitoring the optical output so that the optical output is maintained constant. Therefore, a special type of driver is required to use an edge emitting laser. This results in an increase in complexity of the system.

In contrast, the surface emitting laser employed in the present embodiment has a small threshold current in the range from 0.05 mA to 10 mA, and the temperature dependence of the threshold current can be suppressed to an extremely low level. Therefore, the surface emitting laser can be driven using a simple modulation circuit. Thus, use of the surface emitting laser allows a reduction in the cost of the laser driver.

In the simplest case which needs the lowest cost, an optical signal corresponding to an electric signal can be generated by simply connecting the surface emitting laser to the output of a CMOS circuit forming the parallel-to-serial converter. Furthermore, because the surface emitting laser operates in the single longitudinal mode, it has high monochromaticity and high stability in wavelength which allow it to be coupled with an optical fiber with a high coupling efficiency.

Another advantage of the surface emitting laser is that because it emits light in a direction perpendicular to the semiconductor substrate surface, the surface emitting laser can be mounted by means of chip bonding on an integrated circuit chip such as a CMOS circuit into the form of a hybrid integrated circuit. This form needs a single package and thus a reduction in cost can be achieved.

If a multi-wavelength surface emitting laser is used, it is possible to dispose light emitting parts which emit light with different wavelengths at small intervals of the order of 10 μm. Therefore, by coupling the multi-wavelength surface emitting laser with an optical fiber with a large diameter (100 μm or greater), it becomes possible to transmit light rays with various wavelengths emitted from the multi-wavelength surface emitting laser via the single optical fiber. This allows serial data and a multiplied clock signal or a plurality of serial data and a multiplied clock signal to be transmitted using the single optical fiber.

On the other hand, a multi-beam surface emitting laser has a cross-sectional structure having a plurality of light emitting points (light emitting parts) on a single semiconductor substrate. This structure provides an advantage in terms of layout in that the plurality of light emitting points can be easily positioned with respect to the light incidence end of an optical fiber.

In the case where a plurality of optical fibers bound in the form of a ribbon or a honey comb are employed, the light emitting points of the multi-beam surface emitting laser may be formed at locations corresponding to the array of optical fibers, thereby making it possible to achieve high positioning accuracy, and also making it possible to achieve a multi-fiber transmission system at low cost. This technique also makes it easy to produce the surface emitting laser.

In the first embodiment, as described above, the first bit can be identified by detecting the above pattern in the serial-to-parallel conversion. Therefore, it becomes possible to perform serial-to-parallel conversion without requiring the clock signal to include information indicating the first bit. In this technique, the multiplied clock signal CL1 is transmitted, instead of the dot clock signal CL0.

In the case where image information is transmitted to a CRT or a similar device, it is not required that the number of RGB elements of the CRT be just equal to the number of pixels of the image information. Therefore, in this case, no significant degradation occurs in image quality even if the image information is transmitted using an analog transmission technique. In contrast, in the liquid crystal display panel, it is required that the number of RGB elements should be precisely equal to the number of pixels of the image information. If there is a difference, significant degradation in image quality occurs. In this regard, in the present embodiment, serial-to-parallel conversion can be performed precisely and thus an image can be displayed on the liquid crystal display panel without encountering degradation in image quality. Furthermore, because no PLL is required in the receiving apparatus, a reduction in cost can be achieved.

Although the multiplied clock signal CL1 has a relatively high frequency, the multiplied clock signal CL1 as well as the image information can be transmitted in the form of an optical signal without encountering significant electromagnetic interference (EMI) which is a problem in conventional transmission techniques using electric signals.

In conventional analog transmission systems, the maximum possible transmission distance is limited to a rather small range. In contrast, the combination of digital transmission and optical transmission according to the present embodiment allows long distance transmission. However, the digital transmission needs an extremely high transmission capacity. The optical transmission allows increases in transmission capacity and the maximum allowable transmission distance and reductions in the diameter of the cable and the power consumption.

Use of the multi-wavelength surface emitting laser makes it possible to reduce the frequency band without increasing the number of fibers. If the frequency band is fixed, the multi-wavelength surface emitting laser allows a greater amount of data to be transmitted, and thus it becomes possible to drive a large-sized high-resolution display. Furthermore, use of the multi-beam surface emitting laser makes it possible to increase the transmission capacity without resulting in an increase in the cost of the surface emitting laser.

In the present embodiment, as descried above with reference to FIG. 1, the serial-to-parallel conversion apparatus 120 includes the serial-to-parallel converter 130, the signal generation means 140, and the receivers 60-1 and 60-2, which are all formed on a signal chip. In this case, a circuit such as a preamplifier (transimpedance amplifier) for the pin photodiode is disposed in the optical-to-electric conversion means 150.

In the transmitting apparatus, the parallel-to-serial converter 20, the PLL 30, the drivers 40-1 and 40-2 are constructed on a single chip. Note that these elements including the drivers 40-1 and 40-2 can be constructed on the single chip only when a surface emitting laser is employed and the drivers are constructed using a CMOS circuit or the like.

Figure 10:
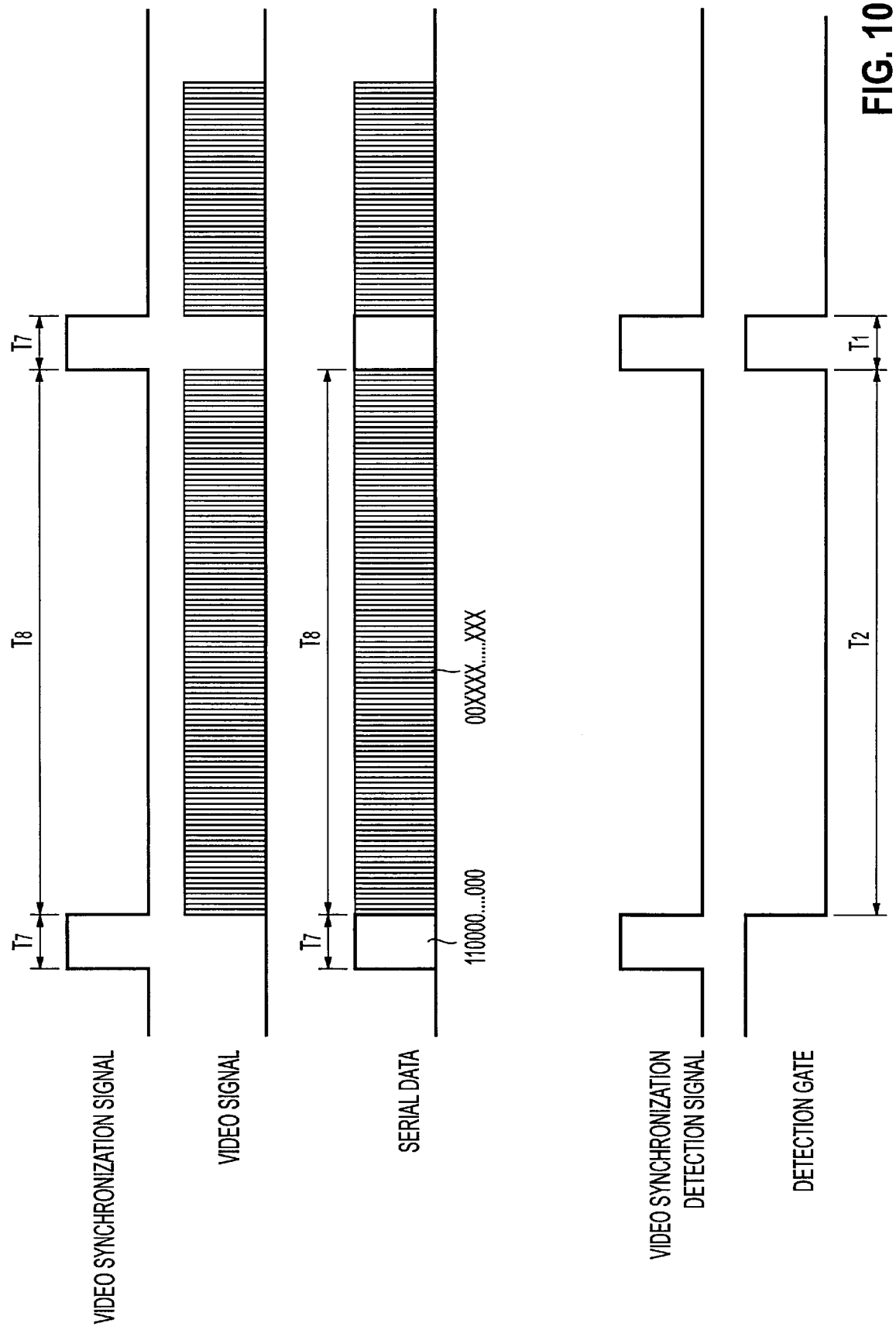
FIG. 10 is a timing chart illustrating an example of the operation of the signal generation means configured as shown in the block diagram of FIG. 2.

Furthermore, in the present embodiment, as described above with reference to the timing chart of FIG. 9, blank periods (T9) are disposed in serial data such that each blank period is placed between each video synchronization data string and the following video data string. However, blank periods T9 are not necessarily required, and video synchronization data strings and video data strings may be placed as shown in the timing chart of FIG. 10. However, in order to obtain a sufficient margin for switching timing, it is desirable to dispose blank periods.

Second Embodiment

Figure 11A:
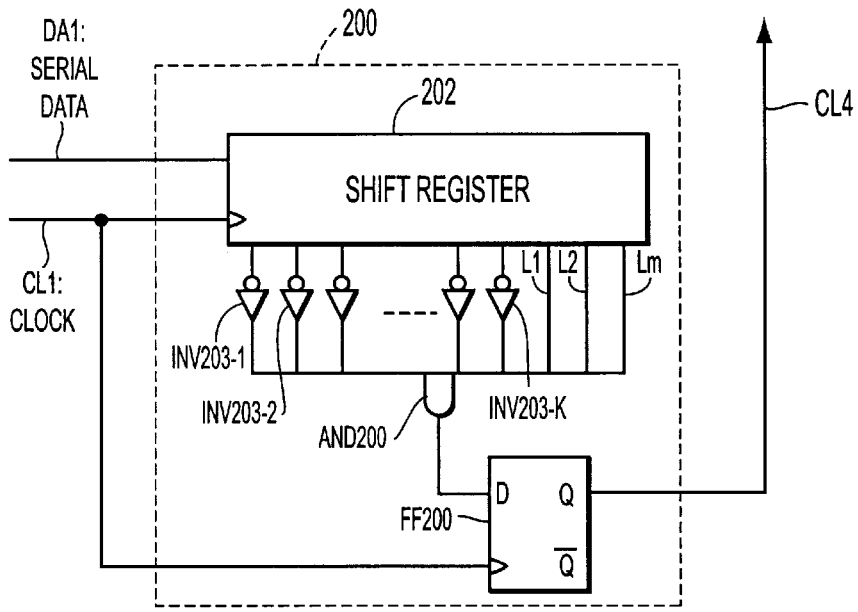
FIG. 11(A) is a circuit diagram illustrating another example of the detailed configuration of the signal generation means in the system shown in FIG. 1.
Figure 11B:
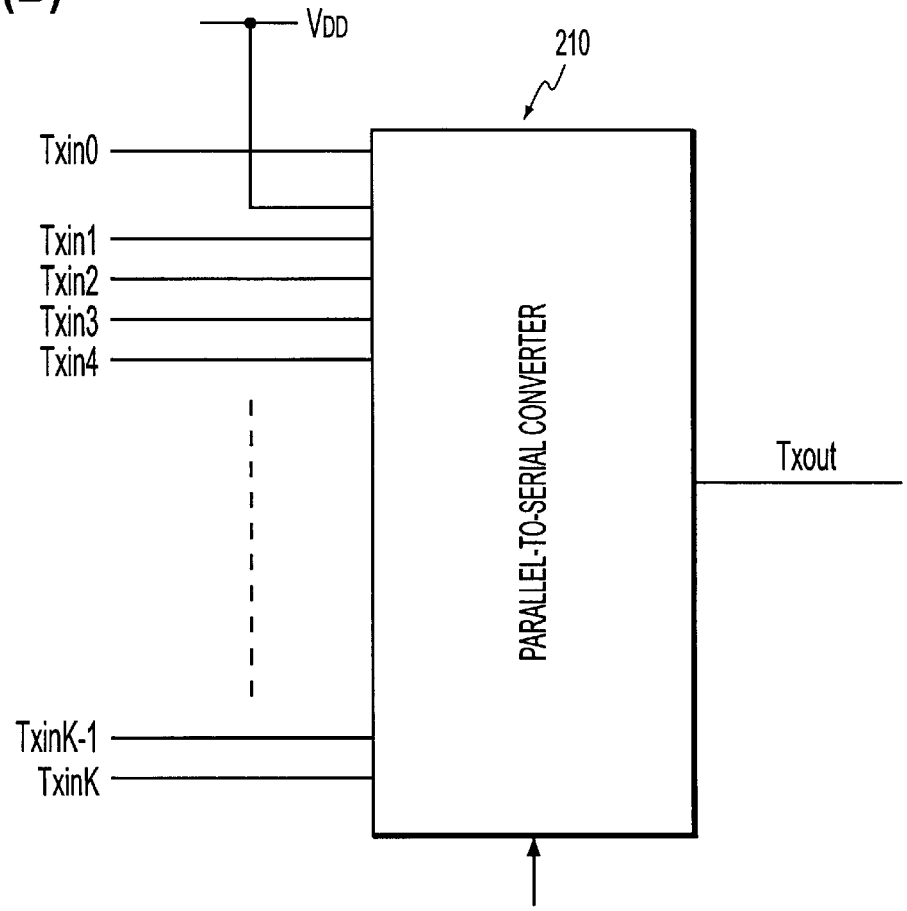
FIG. 11(B) is a block diagram illustrating the details of the parallel-to-serial converter in the system shown in FIG. 1.

A second embodiment of the present invention is now described below. FIGS. 11(A) and 11(B) illustrate an example of a serial-to-parallel conversion apparatus using an overhead bit technique in addition to the detection-gating technique described above. In the following discussion, similar parts to those in the first embodiment are not described.

In the serial-to-parallel conversion apparatus of the present embodiment, as shown in FIG. 11(A), the signal generation means is formed of only a synchronization signal generator 200. This synchronization signal generator 200 is different from the synchronization signal generator employed in the first embodiment in that a synchronization signal CL4 is output only when a unit data string having a unique pattern indicating the start position, which never appears in image intensity level data, is detected in serial data.

In the first embodiment, in the case of an 18-bit color video signal, 2 bits for vertical and horizontal synchronization are added to form each unit data sting. Thus, in the first embodiment, each unit data string comprising 20 bits in total. In the present embodiment, one overhead bit is further added, and thus each unit data string is composed of 21 bits in total. Herein, the most significant bit is used for vertical synchronization (which becomes high during each vertical synchronization period), and the second bit is used as the overhead bit (always at the high level). The third bit is used for horizontal synchronization (which becomes high during each horizontal synchronization period), and the remaining 18 bits are used to represent image intensity level, wherein 6 bits are used for each of R, G, and B levels. Herein, a pattern "111000 . . . 000" (21 bits) is employed as a unique pattern used to indicate the start position, and unit data strings in each image display period are given in the form of "010XXX . . . XXX" (21 bits).

The synchronization signal generator 200 for generating such data strings may be configured as follows.

That is, as shown in FIG. 11(A), output terminals of a shift register 202 are coupled with input terminals of an AND gate AND 200 such that the most significant 3 bits of the outputs are directly connected via lines L1, L2, and L3 (L1, . . . , Lm where m=3) and the remaining 18 bits are connected via 18 inverters INV203-1 to 203-k (k=W−3=21−3=18).

Thus, in the synchronization signal generator 200, data string detection means for detecting a unit data string having the unique pattern is formed of the inverters INV203-1 to 203-k, the lines L1, L2, and L3, the AND gate AND200, and the shift register 202. There is also provided a flip-flop FF200 having a similar function to that of the flip flop FF1 in the first embodiment.

In order to generate unit data strings having the unique pattern "111000 . . . 000" (21 bits), a parallel-to-serial converter 210 serving as data string generation means for generating a data string having the unique pattern in serial data is disposed in a transmitting apparatus as shown in FIG. 11(B).

This parallel-to-serial converter 210, unlike the serial-to-parallel converter in the first embodiment described above, an input terminal corresponding to the second most significant bit is connected to VDD (high-level voltage), and input terminals Txin0–Txink corresponding to the remaining bits are used as normal input terminals.

That is, a data string having the unique pattern "111000 . . . 000" (W bits) can be generated by connecting the input terminal corresponding to the second most significant bit, which should be always "1", to VDD, and the remaining k (k=21−1=20) input terminals Txin0–Txink are used as normal input terminals. A vertical synchronization signal H-sync is input to an input terminal Txin0 corresponding to the most significant bit, and a horizontal synchronization signal V-sync is input to an input terminal Txin1 corresponding to the third most significant bit. R, G, and B signals are input to the remaining bits.

Thus, a 21-bit unit data string whose second bit is always set to "1" as the overhead bit is serially output.

Figures 12, 13:
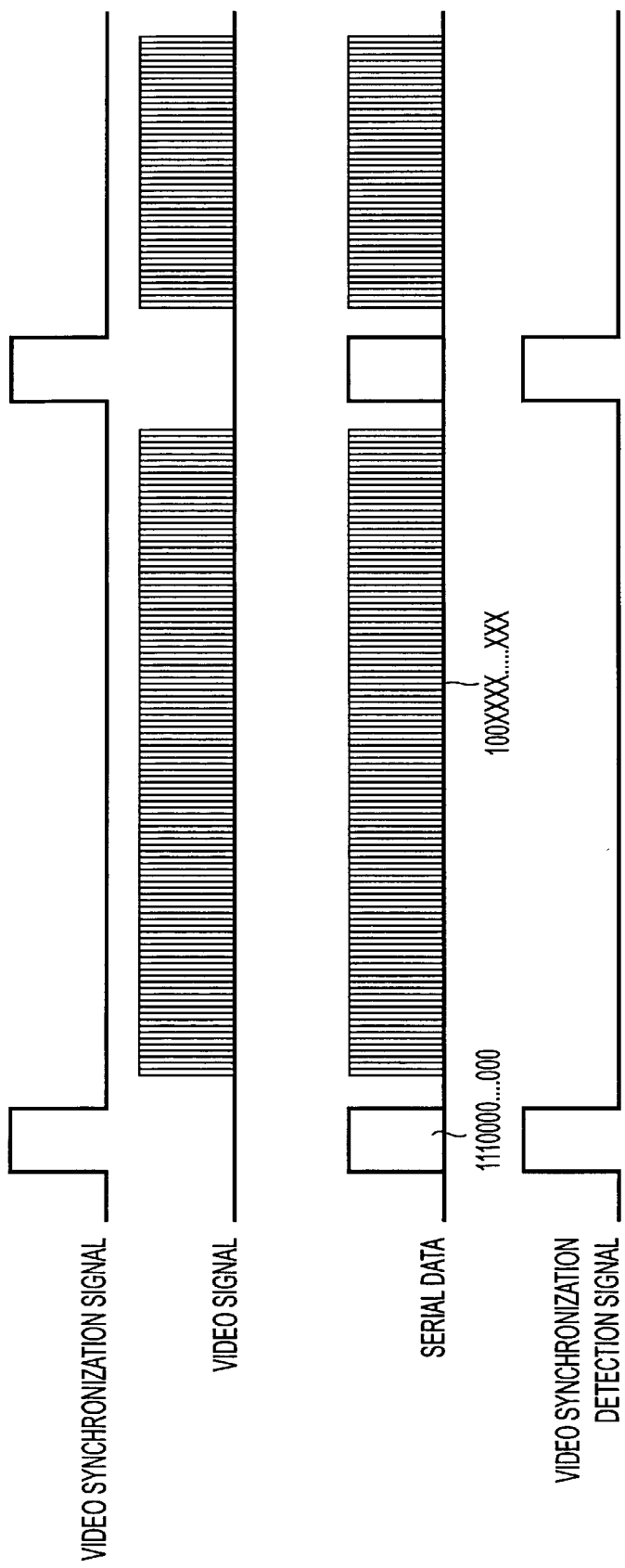
FIG. 12 is a timing chart illustrating the operation of the circuit shown in FIG. 11.
FIG. 13 schematically illustrates examples of data strings in serial data transmitted by the circuit shown in FIG. 12.

When an image signal is transmitted, patterns become, for example, as shown at the top of FIG. 13. On the other hand, when the video synchronization signal is enabled, patterns become, for example, as shown at the bottom of FIG. 13. As can be seen from FIG. 13, a bit pattern having 3 successive "1"s followed by 18 "0"s, that is, "111000000000000000000" never appears in periods during which an image signal is transmitted. In other words, even if 3 successive "1" appear in image intensity level signals, an overhead bit "1" appears within the following 18 bits. Thus, the unique pattern is detected only when the video synchronization signal is enabled as shown in FIG. 12. Therefore, the output CL4 of the flip-flop FF200 can be used as a synchronization signal indicating the start of the video signal. Furthermore, unlike the first embodiment, it is not required to gate the second period T1 shown in FIG. 7 using a circuit including a counter, a comparator, and a flip flop. Therefore, the circuit configuration becomes simpler.

The unique pattern is not limited to the specific example described above. Any unit data string pattern may be employed as long as it never appears in video signals. For example, in stead of using one overhead bit, N (N=1) overhead bits may be used.

Third Embodiment

An embodiment of an electronic device using the above-described information processing apparatus is described below with reference to FIG. 14.

The electronic device of the present embodiment includes the serial-to-parallel conversion apparatus 120 described above and an information processing apparatus 100 connected to this serial-to-parallel conversion apparatus 120.

Figure 14:
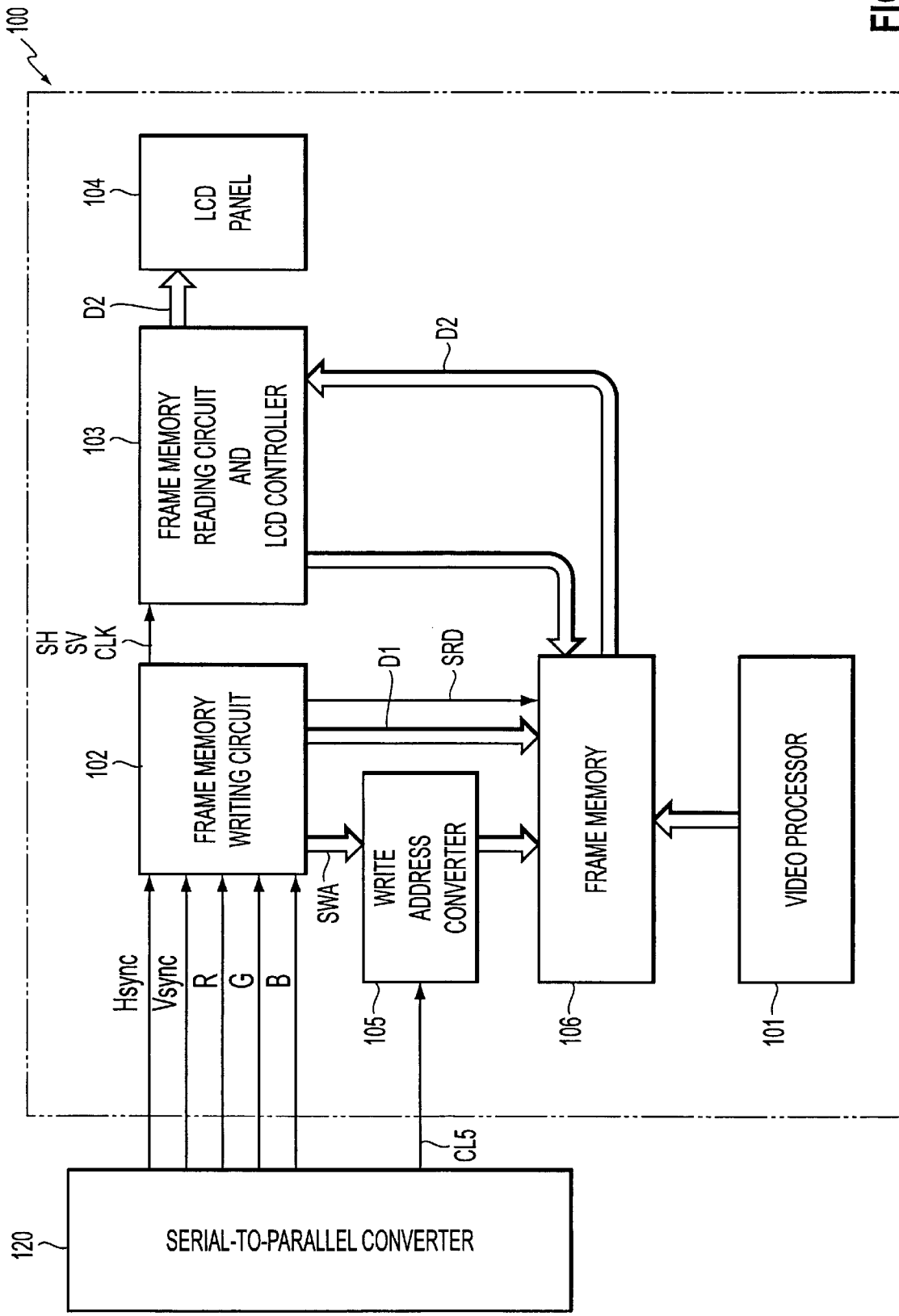
FIG. 14 is a functional block diagram illustrating the details of a liquid crystal display serving as an information processing apparatus in the system shown in FIG. 1.

The information processing apparatus 100 may have an internal structure such as that shown in FIG. 14. That is, the information processing apparatus 100 includes: a frame memory writing circuit 102 which receives video signals R, G, and B, a horizontal synchronization signal HSYNC, and a vertical synchronization signal VSYNC from the serial-to-parallel conversion apparatus 120; a frame memory 106 for storing a video signal as data D1; a frame memory reading circuit and a liquid crystal display controller 103 for reading the video signal from the frame memory 106 and outputting it as display data D2; a liquid crystal display panel 104 for displaying an image; and a video processor 101 connected to the frame memory 106, for performing processes such as interpolation, error correction, and decompression upon the video data.

There is also provided a write address converter 105 for performing, in accordance with the clock control signal CL5, write address conversion and supplying the resultant address to the frame memory 106.

In this apparatus, the frame memory writing circuit 102 generates a writing address SWA and supplies it to the writing address converter 105 in accordance with the horizontal synchronization signal HSYNC and the vertical synchronization signal VSYNC supplied from the serial-to-parallel conversion apparatus 120.

The frame memory writing circuit 102 synchronizes the video signals R, G, and B to the vertical synchronization signal VSYNC and sends the write data D1 and a write/read switching signal SRD to the frame memory 106 in synchronization with the horizontal synchronization signal HSYNC. The write address converter 105 converts the write address SWA to an arbitrary address and sends it to the frame memory 106. Upon receiving the signal SRD, the frame memory 106 goes into a write mode and writes the write data D1 at a specified address.

In synchronization with the signals HSYNC and VSYNC, the frame memory reading circuit and liquid crystal display controller 103 reads data from the frame memory 106 in the same order as is written, and supplies it together with a liquid crystal control signal to the liquid crystal display panel 104.

The liquid crystal display panel 104 includes a liquid crystal display driver. In response to the liquid crystal control signal, the liquid crystal display driver displays an image in synchronization with the horizontal synchronization signal HSYNC which is given a predetermined number of times during each frame period.

One frame of video synchronization signals R, G, and G are written into the frame memory 106 in synchronization with the vertical synchronization signal VSYNC and the horizontal synchronization signal HSYNC. The video signals written in the frame memory 106 are then read in synchronization with the vertical synchronization signal VSYNC and the horizontal synchronization signal HSYNC and displayed in synchronization with a predetermined number of horizontal synchronization signals.

The liquid crystal display panel 104 includes driving means and a display panel constructed in the form of an LCD module. The driving means includes a signal line driver, a scanning line driver, and a power supply circuit.

The electronic device described above may include a display information output source. In this case, the display information output source may include a memory such as a ROM or a RAM and a tuning circuit for outputting a tuned television signal. The liquid crystal display controller may include an amplification/inversion circuit, a phase expansion circuit, a rotation circuit, a gamma correction circuit, and/or clamping circuit.

Specific examples of the electronic device are a liquid crystal projector, a multimedia personal computer (PC), a multimedia engineering work station (EWS), a word processor, a television set, a video tape recorder with a viewfinder or a monitor, a computer, a POS terminal, and an apparatus provided with a touch panel.

Fourth Embodiment

Figure 15:
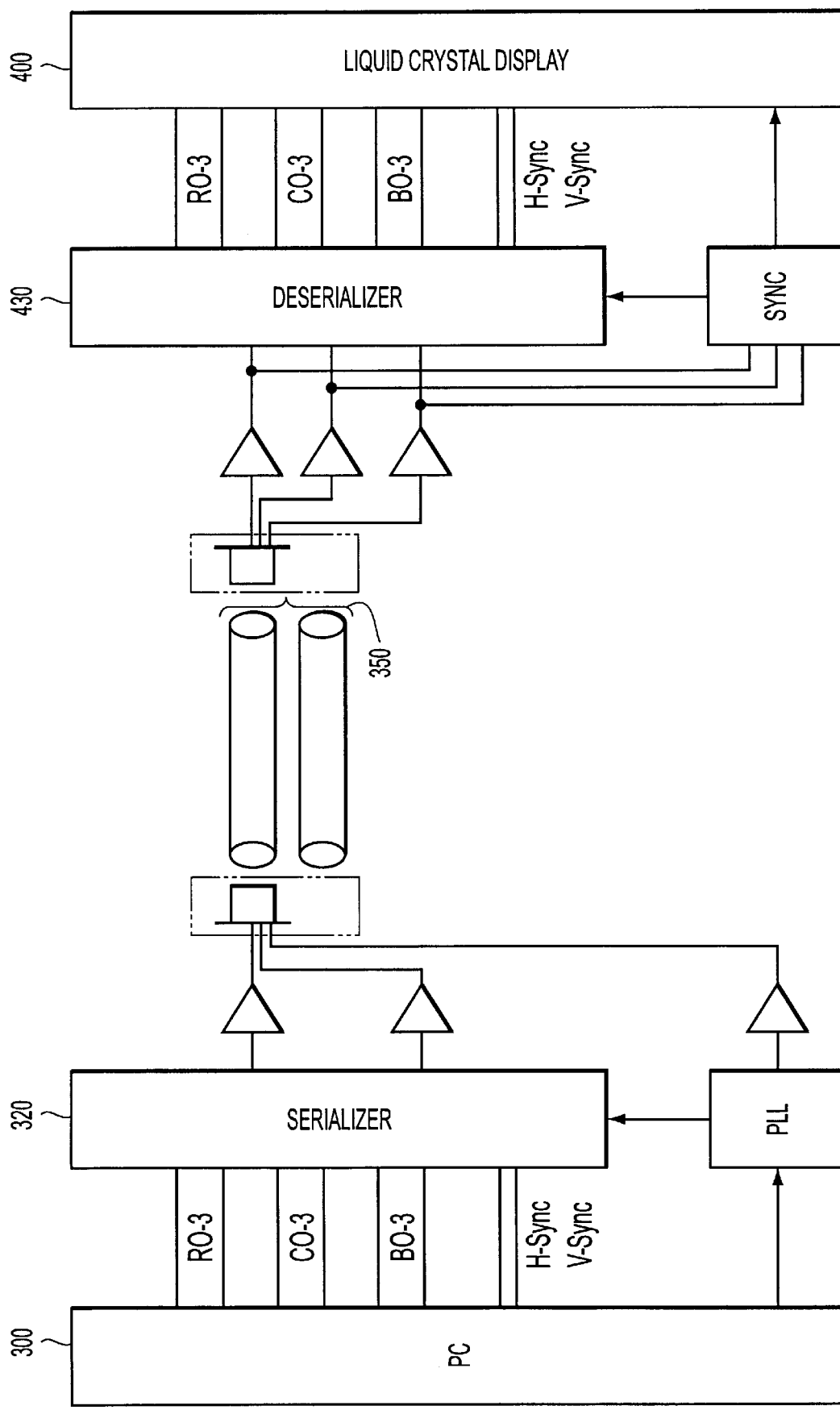
FIG. 15 is a block diagram illustrating another embodiment of an information transmission system according to the present invention.
Figure 16:
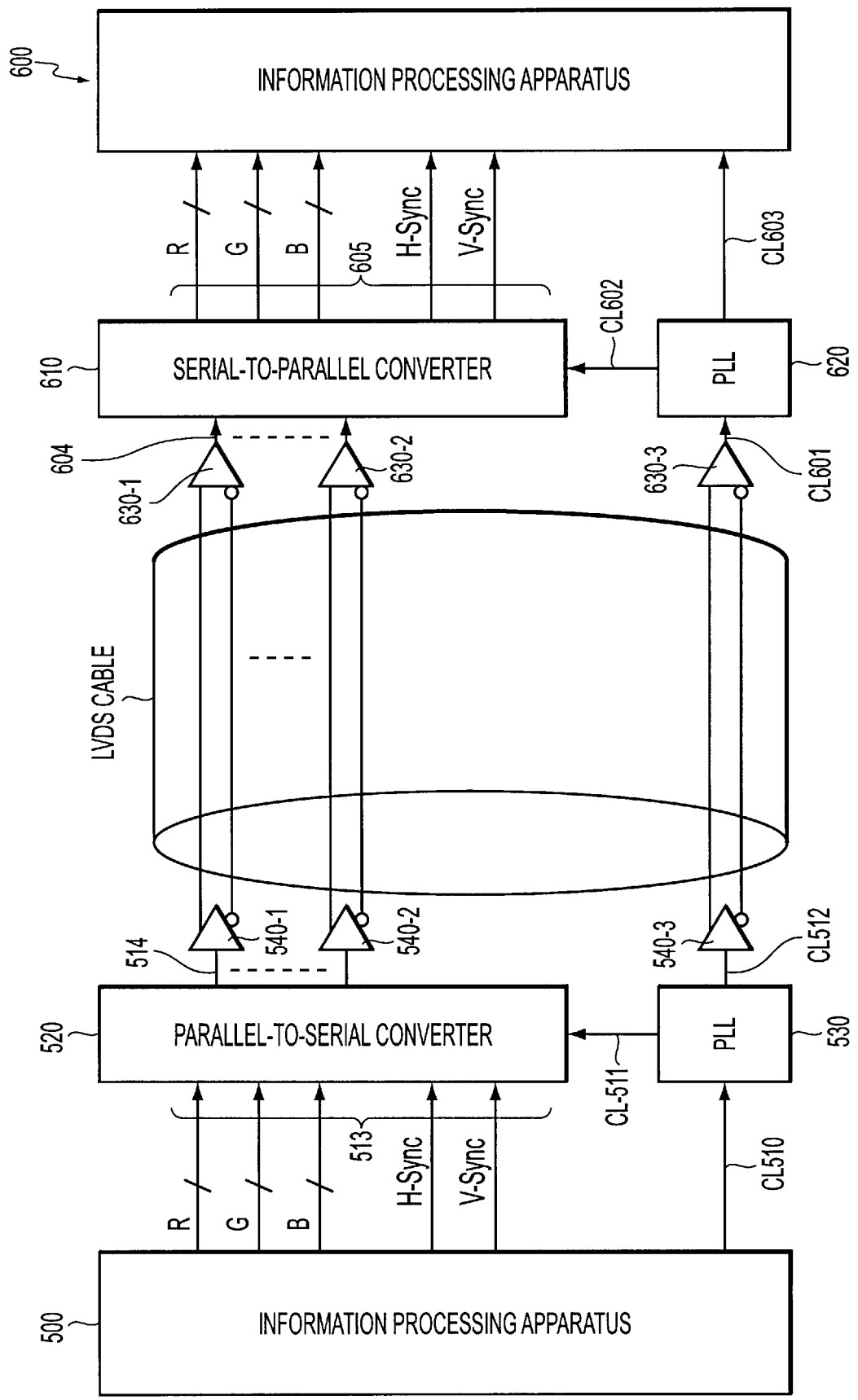
FIG. 16 is a block diagram illustrating the general configuration of a conventional data transmission system.
Figure 17:
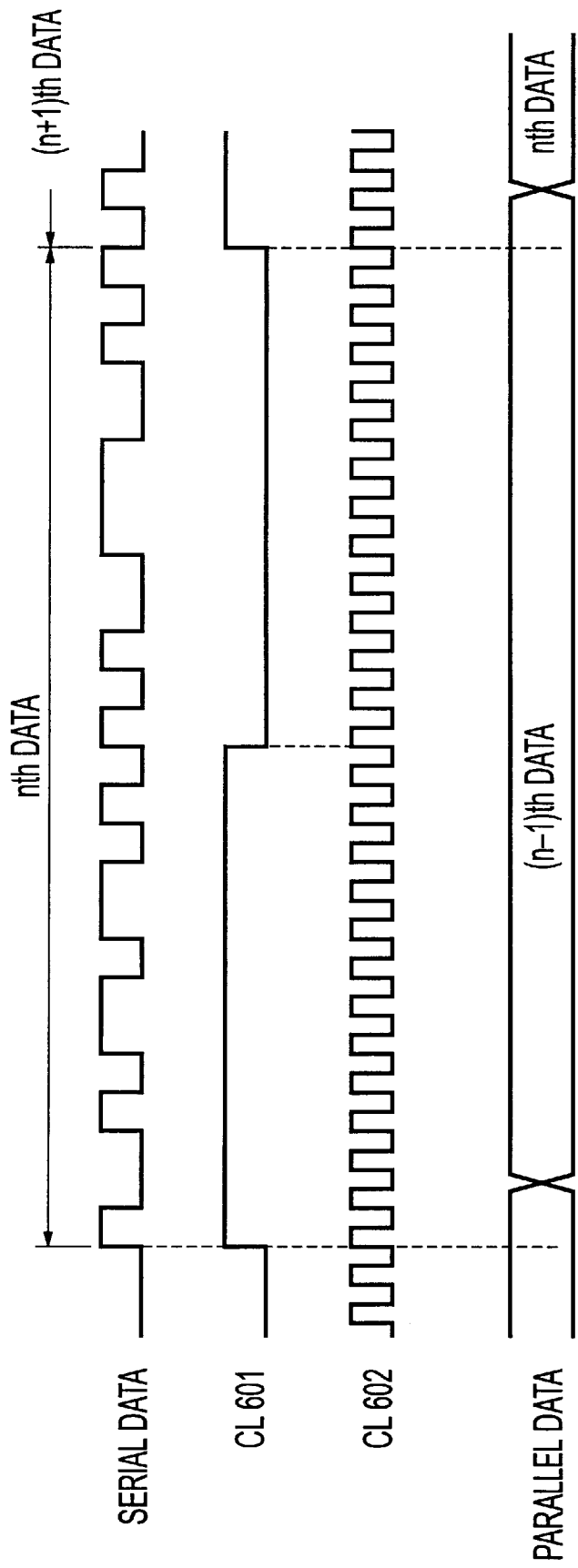
FIGS. 17, 18, and 19 are timing charts illustrating the operation of the system shown in FIG. 16.
Figure 18:
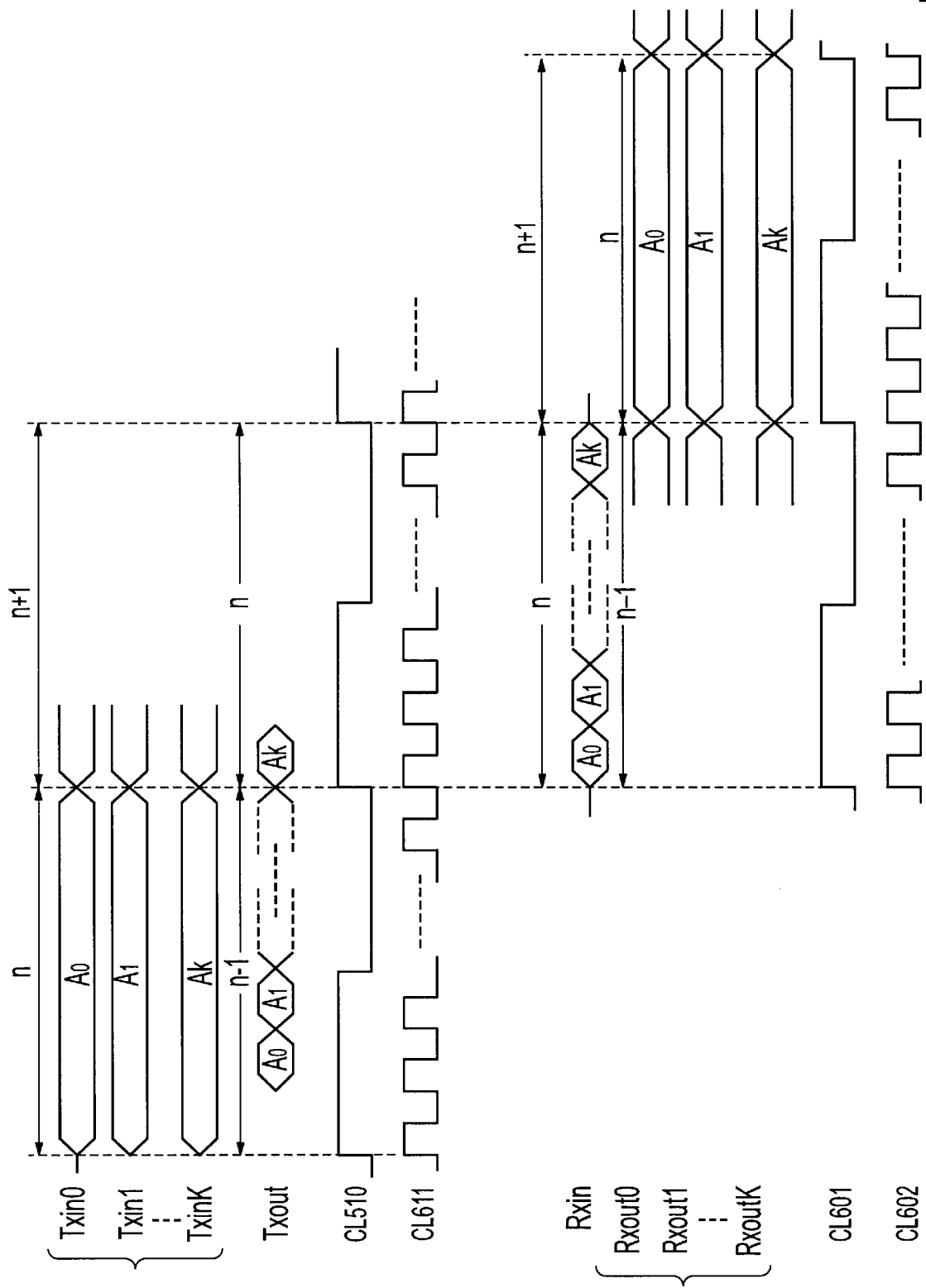
Figure 19:
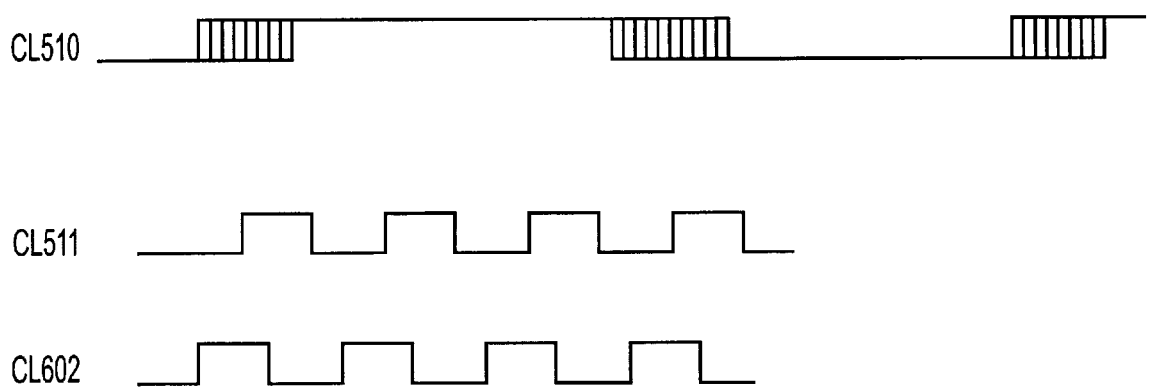

FIG. 15 illustrates an example in which the data transmission system described above is used together with a personal computer and a liquid crystal display of widely-used types.

In FIG. 15, a PC 300 is used as one information processing apparatus, and a liquid crystal display 400 is used as the other information processing apparatus. A serializer 320 is used as the serial-to-parallel converter, and a deserializer 430 is used as the parallel-to-serial converter. The transmission medium is formed of a plurality of optical fibers 350 serving as a plurality of transmission lines for transmitting serial data.

The serializer 320 has a plurality of output terminals and the deserializer 430 has a plurality of input terminals so that a plurality of serial data can be transmitted in parallel depending on the amount of data. There may be provided a plurality of transmission lines for transmitting clock signals, as required.

Although the present invention has been described above with reference to specific embodiments of apparatus and methods, those skilled in the art will appreciate that various modifications can be made without departing from the spirit and scope of the present invention. For example, although in the embodiments described above, 110000 . . . 000 is employed as the unique data string pattern, the present invention is not limited to such a pattern. What is essential is that the data string has a unique pattern which never appears in the video signal. Thus, any pattern such as "000011100001", "0000 . . . 00001111", or "0000 . . . 0001111" may be employed as long as it is unique. A data string having such a unique pattern may be produced by configuring the parallel-to-serial converter serving as the unique pattern generator in the transmitting apparatus such that a particular pin corresponding to a bit which should be "1" is set to a high level, and by configuring the synchronization signal generator in the signal generation means such that the outputs of the shift register 142 and the inputs of the AND gate AND1 are connected in a manner corresponding to the unique pattern.

For example, in the case where "0000 . . . 0000111" is employed as the unique pattern, the VCC voltage is supplied to three lowest-order input terminals of the parallel-to-serial converter 20, and the synchronization signal generator is configured such that the leftmost three outputs are directly connected via lines L1, L2, and L3, and the remaining outputs are connected via inverters.

Furthermore, although a LCD display is employed as the display in the embodiments described above, the invention is not limited to the LCD display. For example, a small-sized television set using a thin-shaped CRT or a liquid crystal shutter, a plasma display, or an electroluminescence display may also be employed.

A system may include two liquid crystal displays each including transmitting and receiving apparatus using a serial-to-parallel conversion apparatus according to the invention thereby allowing two-way communication.

What is claimed is:

1. A serial-to-parallel conversion apparatus, comprising:
   a data converter that samples serial data comprising a first data string that includes one or more unit data strings, each data string including a predetermined number of bits, the serial data being input after a synchronization period in accordance with a clock signal which has been used to generate the serial data by converting original parallel data into serial form from one unit data string to another; and
   a signal generator that generates a synchronization signal corresponding to the synchronization period, on the basis of the serial data, the serial data including a second data string for synchronization detection within the synchronization period, the second data string including one or more unit data strings each having a predetermined bit pattern, the signal generator generating the synchronization signal when detecting the unit data string in the second data string, and the data converter detecting the start position of the unit data string in the first data string based on the synchronization signal.

2. The serial-to-parallel conversion apparatus according to claim 1, the bit pattern of the unit data string in the second data string being a unique pattern different from any bit pattern in the unit data string in the first data string.

3. The serial-to-parallel conversion apparatus according to claim 2, the signal generator including a data string detector to which the clock signal and the serial data are input, that detects the unit data string in the second data string from the serial data thereby outputting the synchronization signal.

4. The serial-to-parallel conversion apparatus according to claim 3, the data string detector including a data storing device that temporarily stores the serial data from one unit data string to another in accordance with the clock signal, and a synchronization signal output device that outputs the synchronization signal when the unit data string stored by the data storage device has the predetermined bit pattern.

5. The serial-to-parallel conversion apparatus according to claim 1, the signal generator including a data string detector to which the clock signal and the serial data are input, that outputs an auxiliary synchronization signal each time the unit data string in the second data string is detected from the serial data, and a synchronization signal output device that outputs the synchronization signal when a plurality of the auxiliary synchronization signals output from the data string detector are detected.

6. The serial-to-parallel conversion apparatus according to claim 5, the data string detector including a data storage device that temporarily stores the serial data from one unit data string to another in accordance with the clock signal, and an auxiliary synchronization signal output device that outputs the auxiliary synchronization signal when the unit data string held by the data storage device has the predetermined bit pattern.

7. The serial-to-parallel conversion apparatus according to claim 5, the signal generator further including a period control signal generator that generating a period control signal whose voltage level is set to a predetermined value over a second period entirely containing a first period, from its beginning to its end, in which a plurality of auxiliary synchronization signals are successively output, and the synchronization output device outputting the auxiliary synchronization signal when the unit data string has the predetermined bit pattern.

8. The serial-to-parallel conversion apparatus according to claim 5, the signal generator further including a period control signal generator that generating a period control signal whose voltage level is set to a predetermined value over a second period entirely containing a first period, from its beginning to its end, in which a plurality of auxiliary synchronization signals are successively output, and the auxiliary synchronization output device outputting the auxiliary synchronization signal when the unit data string has the predetermined bit pattern.

9. The serial-to-parallel conversion apparatus according to claim 7, the detection signal generator including a first setting device that sets the start timing of the second period in accordance with the auxiliary synchronization signal and the clock signal, a second setting device that sets the end timing of the second period in accordance with the auxiliary synchronization signal and the clock signal, and a controller that controls the voltage of the period control signal in accordance with the setting of the first and second setting device.

10. The serial-to-parallel conversion apparatus according to claim 8, the detection signal generator including a first setting device that sets the start timing of the second period in accordance with the auxiliary synchronization signal and the clock signal, a second setting device that sets the end timing of the second period in accordance with the auxiliary synchronization signal and the clock signal, and a controller that controls the voltage of the period control signal in accordance with the setting of the first and second setting device.

11. The semiconductor device, comprising:
   the serial-to-parallel conversion apparatus according claim 1, the serial-to-parallel conversion apparatus being disposed on a semiconductor substrate.

12. An electronic device, comprising:
   the serial-to-parallel conversion apparatus according to claim 1; and
   a display unit that displays an image in accordance with parallel data converted bay the serial-to-parallel conversion apparatus.

13. The serial-to-parallel conversion apparatus according to claim 1, the second data string including one or more unit data strings each comprising a plurality of bits having a predetermined bit pattern.

14. The serial-to-parallel conversion apparatus according to claim 1, the data converter detecting the start position of the unit data string in the first data string based on the synchronization signal without variably delaying the first data string.

15. A data transmission system for transferring data from a transmitting apparatus to a receiving apparatus, the transmitting apparatus comprising:
   an information supplying source that outputs a first clock signal and parallel data;
   a second clock signal generator that generates a second clock signal by multiplying the first clock signal; and
   a parallel-to-serial conversion apparatus that samples the parallel data in synchronization with the second clock signal and serially outputs data strings comprising unit data strings each having a period corresponding to one cycle of the first clock signal such that a second data string including one or more unit data strings each having a particular bit pattern for synchronization detection is serially output during a synchronization period and such that a first data string including one or more unit data strings is serially output during a period following the synchronization period;
   the receiving apparatus comprising:
      a receiving device that receives the serial data and the second clock signal from the parallel-to-serial conversion apparatus;
      a signal generator that detects the second data string in the serial data and generates a synchronization signal corresponding to the synchronization period; and
      a serial-to-parallel conversion apparatus that detects the start position of the unit data string contained in the first data string in the serial data based on the synchronization signal and samples the serial data in synchronization with the second clock signal to convert the serial data into parallel data from one unit data string to another.

16. The data transmission system according to claim 15, the transmitting apparatus including an electric-to-optical signal converter that converts the serial data in the form of an electric signal to an optical signal.

17. The data transmission system according to claim 16, the electric-to-optical signal converter including a surface emitting laser.

18. The data transmission system according to claim 16, the electric-to-optical signal converter including a multi-wavelength surface emitting laser.

19. The data transmission system according to claim 16, a transmission medium that transmits the second clock signal and the serial data being formed of a plurality of optical fibers, and the electric-to-optical signal converter being formed of a multi-beam surface emitting laser.

20. The data transmission system according to claim 15, the second data string including one or more unit data strings each comprising a plurality of bits having a particular bit pattern.

21. The data transmission system according to claim 15, the serial-to-parallel conversion apparatus detecting the start position of the unit data string contained in the first data string in the serial data based on the synchronization signal and samples the serial data in synchronization with the second clock signal without variably delaying the serial data to convert the serial data into parallel data from one unit data string to another.

* * * * *